United States Patent
Deng et al.

(10) Patent No.: US 11,972,952 B2
(45) Date of Patent: Apr. 30, 2024

(54) ATOMIC LAYER DEPOSITION ON 3D NAND STRUCTURES

(71) Applicant: Lam Research Corporation, Fremont, CA (US)

(72) Inventors: Ruopeng Deng, San Jose, CA (US); Xiaolan Ba, Fremont, CA (US); Tianhua Yu, Tracy, CA (US); Yu Pan, San Jose, CA (US); Juwen Gao, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 99 days.

(21) Appl. No.: 17/312,594

(22) PCT Filed: Dec. 13, 2019

(86) PCT No.: PCT/US2019/066301
§ 371 (c)(1),
(2) Date: Jun. 10, 2021

(87) PCT Pub. No.: WO2020/123987
PCT Pub. Date: Jun. 18, 2020

(65) Prior Publication Data
US 2021/0335617 A1    Oct. 28, 2021

Related U.S. Application Data

(60) Provisional application No. 62/780,006, filed on Dec. 14, 2018.

(51) Int. Cl.
*H01L 21/76* (2006.01)
*H01L 21/285* (2006.01)
(Continued)

(52) U.S. Cl.
CPC .. *H01L 21/28562* (2013.01); *H01L 21/28568* (2013.01); *H01L 21/76876* (2013.01);
(Continued)

(58) Field of Classification Search
None
See application file for complete search history.

(56) References Cited

U.S. PATENT DOCUMENTS

| 4,746,375 A | 5/1988 | Iacovangelo |
| 4,804,560 A | 2/1989 | Shioya et al. |

(Continued)

FOREIGN PATENT DOCUMENTS

| CN | 101154576 A | 4/2008 |
| CN | 101308794 A | 11/2008 |

(Continued)

OTHER PUBLICATIONS

U.S. Office Action, dated Apr. 7, 2014, issued in U.S. Appl. No. 13/633,502.

(Continued)

*Primary Examiner* — Bradley Smith
(74) *Attorney, Agent, or Firm* — Weaver Austin Villeneuve & Sampson LLP

(57) ABSTRACT

Methods and apparatuses are described that provide tungsten deposition with low roughness. In some embodiments, the methods involve co-flowing nitrogen with hydrogen during an atomic layer deposition process of depositing tungsten that uses hydrogen as a reducing agent. In some embodiments, the methods involve depositing a cap layer, such as tungsten oxide or amorphous tungsten layer, on a sidewall surface of a 3D NAND structure. The disclosed embodiments have a wide variety of applications including depositing tungsten into 3D NAND structures.

16 Claims, 13 Drawing Sheets

(51) Int. Cl.
*H01L 21/768* (2006.01)
*H10B 41/27* (2023.01)
*H10B 43/27* (2023.01)

(52) U.S. Cl.
CPC ........ *H01L 21/76877* (2013.01); *H10B 41/27* (2023.02); *H10B 43/27* (2023.02)

(56) References Cited

U.S. PATENT DOCUMENTS

| | | |
|---|---|---|
| 4,874,719 A | 10/1989 | Kurosawa |
| 4,962,063 A | 10/1990 | Maydan et al. |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,633,200 A | 5/1997 | Hu |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,916,365 A | 6/1999 | Sherman |
| 5,916,634 A | 6/1999 | Fleming et al. |
| 5,926,720 A | 7/1999 | Zhao et al. |
| 5,956,609 A | 9/1999 | Lee et al. |
| 5,963,833 A | 10/1999 | Thakur |
| 5,994,749 A | 11/1999 | Oda |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,260,266 B1 | 7/2001 | Tamaki |
| 6,265,312 B1 | 7/2001 | Sidhwa et al. |
| 6,277,744 B1 | 8/2001 | Yuan et al. |
| 6,284,316 B1 | 9/2001 | Sandhu et al. |
| 6,287,965 B1 | 9/2001 | Kang et al. |
| 6,294,468 B1 | 9/2001 | Gould-Choquette et al. |
| 6,297,152 B1 | 10/2001 | Itoh et al. |
| 6,306,211 B1 | 10/2001 | Takahashi et al. |
| 6,309,964 B1 | 10/2001 | Tsai et al. |
| 6,309,966 B1 | 10/2001 | Govindarajan et al. |
| 6,310,300 B1 | 10/2001 | Cooney et al. |
| 6,340,629 B1 | 1/2002 | Yeo et al. |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,491,978 B1 | 12/2002 | Kalyanam |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,585 B2 | 5/2004 | Yoon et al. |
| 6,777,331 B2 | 8/2004 | Nguyen |
| 6,794,287 B2 | 9/2004 | Saanila et al. |
| 6,797,340 B2 | 9/2004 | Fang et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,338,900 B2 | 3/2008 | Mizuno et al. |
| 7,355,254 B2 | 4/2008 | Datta et al. |
| 7,405,158 B2 | 7/2008 | Lai et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,485,340 B2 | 2/2009 | Elers et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,964,505 B2 | 6/2011 | Khandelwal et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,071,478 B2 | 12/2011 | Wu et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,119,527 B1 | 2/2012 | Chandrashekar et al. |
| 8,129,270 B2 | 3/2012 | Chandrashekar et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 8,853,080 B2 | 10/2014 | Guan et al. |
| 8,975,184 B2 | 3/2015 | Chen et al. |
| 8,993,055 B2 | 3/2015 | Rahtu et al. |
| 9,034,760 B2 | 5/2015 | Chen et al. |
| 9,064,684 B1 | 6/2015 | Mui et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,236,297 B2 | 1/2016 | Chen et al. |
| 9,240,347 B2 | 1/2016 | Chandrashekar et al. |
| 9,583,385 B2 | 2/2017 | Lee et al. |
| 9,589,808 B2 | 3/2017 | Bamnolker et al. |
| 9,613,818 B2 | 4/2017 | Ba et al. |

(56) References Cited

U.S. PATENT DOCUMENTS

| | | | |
|---|---|---|---|
| 9,653,353 | B2 | 5/2017 | Chandrashekar et al. |
| 9,673,146 | B2 | 6/2017 | Chen et al. |
| 9,754,824 | B2 | 9/2017 | Schloss et al. |
| 9,969,622 | B2 | 5/2018 | Lei et al. |
| 9,978,605 | B2 | 5/2018 | Bamnolker et al. |
| 10,103,058 | B2 | 10/2018 | Chandrashekar et al. |
| 10,546,751 | B2 | 1/2020 | Bamnolker et al. |
| 11,348,795 | B2 | 5/2022 | Schloss et al. |
| 11,549,175 | B2 | 1/2023 | Butail et al. |
| 2001/0007797 | A1 | 7/2001 | Jang et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0037630 | A1 | 3/2002 | Agarwal et al. |
| 2002/0048938 | A1 | 4/2002 | Ishizuka et al. |
| 2002/0090796 | A1 | 7/2002 | Desai et al. |
| 2002/0117399 | A1 | 8/2002 | Chen et al. |
| 2002/0155722 | A1 | 10/2002 | Satta et al. |
| 2002/0168840 | A1 | 11/2002 | Hong et al. |
| 2002/0177316 | A1 | 11/2002 | Miller et al. |
| 2002/0190379 | A1 | 12/2002 | Jian et al. |
| 2003/0013300 | A1 | 1/2003 | Byun |
| 2003/0059980 | A1 | 3/2003 | Chen et al. |
| 2003/0082296 | A1 | 5/2003 | Elers et al. |
| 2003/0082902 | A1 | 5/2003 | Fukui et al. |
| 2003/0091870 | A1 | 5/2003 | Bhowmik et al. |
| 2003/0104126 | A1 | 6/2003 | Fang et al. |
| 2003/0123216 | A1 | 7/2003 | Yoon et al. |
| 2003/0127043 | A1 | 7/2003 | Lu et al. |
| 2003/0129828 | A1 | 7/2003 | Cohen et al. |
| 2003/0190802 | A1 | 10/2003 | Wang et al. |
| 2003/0209193 | A1 | 11/2003 | Van Wijck |
| 2003/0224217 | A1 | 12/2003 | Byun et al. |
| 2004/0014315 | A1 | 1/2004 | Lai et al. |
| 2004/0044127 | A1 | 3/2004 | Okubo et al. |
| 2004/0142557 | A1 | 7/2004 | Levy et al. |
| 2004/0151845 | A1 | 8/2004 | Nguyen et al. |
| 2004/0202786 | A1 | 10/2004 | Wongsenakhum et al. |
| 2004/0206267 | A1 | 10/2004 | Sambasivan et al. |
| 2004/0247788 | A1 | 12/2004 | Fang et al. |
| 2005/0009325 | A1 | 1/2005 | Chung et al. |
| 2005/0031786 | A1* | 2/2005 | Lee ............... H01L 21/28556 |
| | | | 257/E21.585 |
| 2005/0059236 | A1 | 3/2005 | Nishida et al. |
| 2005/0136594 | A1 | 6/2005 | Kim |
| 2005/0191803 | A1 | 9/2005 | Matsuse et al. |
| 2006/0003581 | A1 | 1/2006 | Johnston et al. |
| 2006/0040052 | A1 | 2/2006 | Fang et al. |
| 2006/0094238 | A1 | 5/2006 | Levy et al. |
| 2006/0145190 | A1 | 7/2006 | Salzman et al. |
| 2006/0211244 | A1 | 9/2006 | Deshpande et al. |
| 2006/0265100 | A1 | 11/2006 | Li |
| 2006/0284317 | A1 | 12/2006 | Ito et al. |
| 2007/0009658 | A1 | 1/2007 | Yoo et al. |
| 2007/0087560 | A1 | 4/2007 | Kwak et al. |
| 2007/0099420 | A1 | 5/2007 | Dominquez et al. |
| 2007/0190780 | A1 | 8/2007 | Chung et al. |
| 2007/0264105 | A1 | 11/2007 | Pharand et al. |
| 2008/0017891 | A1 | 1/2008 | Datta et al. |
| 2008/0045010 | A1 | 2/2008 | Wongsenakhum et al. |
| 2008/0081127 | A1 | 4/2008 | Thompson et al. |
| 2008/0081452 | A1 | 4/2008 | Kim et al. |
| 2008/0081453 | A1 | 4/2008 | Kim et al. |
| 2008/0081470 | A1 | 4/2008 | Clark |
| 2008/0124926 | A1 | 5/2008 | Chan et al. |
| 2008/0248649 | A1 | 10/2008 | Adetutu et al. |
| 2008/0254619 | A1 | 10/2008 | Lin et al. |
| 2008/0254623 | A1 | 10/2008 | Chan et al. |
| 2008/0268642 | A1 | 10/2008 | Yanagita et al. |
| 2008/0280438 | A1 | 11/2008 | Lai et al. |
| 2008/0283844 | A1 | 11/2008 | Hoshi et al. |
| 2008/0317954 | A1 | 12/2008 | Lu et al. |
| 2008/0317972 | A1 | 12/2008 | Hendriks et al. |
| 2009/0045517 | A1 | 2/2009 | Sugiura et al. |
| 2009/0050937 | A1 | 2/2009 | Murata et al. |
| 2009/0053893 | A1 | 2/2009 | Khandelwal et al. |
| 2009/0137117 | A1 | 5/2009 | Park et al. |
| 2009/0142509 | A1 | 6/2009 | Yamamoto |
| 2009/0149022 | A1 | 6/2009 | Chan et al. |
| 2009/0156004 | A1 | 6/2009 | Kori et al. |
| 2009/0160030 | A1 | 6/2009 | Tuttle |
| 2009/0163025 | A1 | 6/2009 | Humayun et al. |
| 2009/0315154 | A1 | 12/2009 | Kirby et al. |
| 2009/0321943 | A1 | 12/2009 | Meldrim et al. |
| 2010/0007797 | A1 | 1/2010 | Stojancic |
| 2010/0035427 | A1 | 2/2010 | Chan et al. |
| 2010/0055904 | A1 | 3/2010 | Chen et al. |
| 2010/0062149 | A1 | 3/2010 | Ma et al. |
| 2010/0072623 | A1 | 3/2010 | Prindle et al. |
| 2010/0120245 | A1 | 5/2010 | Tjandra et al. |
| 2010/0130002 | A1 | 5/2010 | Dao et al. |
| 2010/0130003 | A1 | 5/2010 | Lin et al. |
| 2010/0144140 | A1 | 6/2010 | Chandrashekar et al. |
| 2010/0155846 | A1 | 6/2010 | Mukherjee et al. |
| 2010/0159694 | A1 | 6/2010 | Chandrashekar et al. |
| 2010/0167527 | A1 | 7/2010 | Wu et al. |
| 2010/0171220 | A1* | 7/2010 | Huang ............... H01L 21/76856 |
| | | | 257/E23.161 |
| 2010/0244141 | A1 | 9/2010 | Beyer et al. |
| 2010/0244260 | A1 | 9/2010 | Hinomura |
| 2010/0267230 | A1 | 10/2010 | Chandrashekar et al. |
| 2010/0267235 | A1 | 10/2010 | Chen et al. |
| 2010/0273327 | A1 | 10/2010 | Chan et al. |
| 2010/0330800 | A1 | 12/2010 | Ivanov et al. |
| 2011/0020546 | A1 | 1/2011 | Hamalainen et al. |
| 2011/0059608 | A1 | 3/2011 | Gao et al. |
| 2011/0156154 | A1 | 6/2011 | Hoentschel et al. |
| 2011/0221044 | A1 | 9/2011 | Danek et al. |
| 2011/0223763 | A1 | 9/2011 | Chan et al. |
| 2011/0233778 | A1 | 9/2011 | Lee et al. |
| 2011/0236594 | A1 | 9/2011 | Haverkamp et al. |
| 2011/0281438 | A1 | 11/2011 | Lee et al. |
| 2012/0009785 | A1 | 1/2012 | Chandrashekar et al. |
| 2012/0015518 | A1 | 1/2012 | Chandrashekar et al. |
| 2012/0040530 | A1 | 2/2012 | Humayun et al. |
| 2012/0077342 | A1 | 3/2012 | Gao et al. |
| 2012/0164832 | A1 | 6/2012 | Chandrashekar et al. |
| 2012/0199887 | A1 | 8/2012 | Chan et al. |
| 2012/0225192 | A1 | 9/2012 | Yudovsky et al. |
| 2012/0231626 | A1 | 9/2012 | Lee et al. |
| 2012/0244699 | A1 | 9/2012 | Khandelwal et al. |
| 2012/0294874 | A1 | 11/2012 | Macary et al. |
| 2013/0043554 | A1 | 2/2013 | Piper |
| 2013/0062677 | A1 | 3/2013 | Li et al. |
| 2013/0109172 | A1 | 5/2013 | Collins et al. |
| 2013/0168864 | A1 | 7/2013 | Lee et al. |
| 2013/0285195 | A1 | 10/2013 | Piper |
| 2013/0302980 | A1 | 11/2013 | Chandrashekar et al. |
| 2014/0011358 | A1 | 1/2014 | Chen et al. |
| 2014/0027664 | A1 | 1/2014 | Lei et al. |
| 2014/0030889 | A1 | 1/2014 | Chen et al. |
| 2014/0061784 | A1 | 3/2014 | Kang |
| 2014/0061931 | A1 | 3/2014 | Kang |
| 2014/0073135 | A1 | 3/2014 | Guan et al. |
| 2014/0154883 | A1 | 6/2014 | Humayun et al. |
| 2014/0162451 | A1 | 6/2014 | Chen et al. |
| 2014/0209026 | A1 | 7/2014 | LaVoie et al. |
| 2014/0308812 | A1 | 10/2014 | Arghavani et al. |
| 2014/0319614 | A1 | 10/2014 | Paul et al. |
| 2015/0037972 | A1 | 2/2015 | Danek et al. |
| 2015/0056803 | A1 | 2/2015 | Chandrashekar et al. |
| 2015/0179461 | A1 | 6/2015 | Bamnolker et al. |
| 2015/0240359 | A1 | 8/2015 | Jdira et al. |
| 2015/0279732 | A1 | 10/2015 | Lee et al. |
| 2015/0325475 | A1 | 11/2015 | Bamnolker et al. |
| 2016/0118345 | A1 | 4/2016 | Chen et al. |
| 2016/0190008 | A1 | 6/2016 | Chandrashekar et al. |
| 2016/0233220 | A1 | 8/2016 | Danek et al. |
| 2016/0293467 | A1 | 10/2016 | Caveney et al. |
| 2016/0336222 | A1 | 11/2016 | Knapp et al. |
| 2016/0351401 | A1 | 12/2016 | Ba et al. |
| 2016/0351402 | A1 | 12/2016 | Suzuki et al. |
| 2016/0351444 | A1 | 12/2016 | Schloss et al. |

(56) References Cited

U.S. PATENT DOCUMENTS

| | | | |
|---|---|---|---|
| 2017/0040214 A1 | 2/2017 | Lai et al. | |
| 2017/0069527 A1 | 3/2017 | Haukka et al. | |
| 2017/0117155 A1 | 4/2017 | Bamnolker et al. | |
| 2017/0133231 A1 | 5/2017 | Bamnolker et al. | |
| 2017/0306479 A1 | 10/2017 | Raisanen et al. | |
| 2017/0306490 A1 | 10/2017 | Chan et al. | |
| 2017/0365513 A1 | 12/2017 | Yang et al. | |
| 2018/0053660 A1 | 2/2018 | Jandl et al. | |
| 2018/0076042 A1 | 3/2018 | Cheng et al. | |
| 2018/0240675 A1 | 8/2018 | Bamnolker et al. | |
| 2019/0019725 A1 | 1/2019 | Chandrashekar et al. | |
| 2021/0238736 A1 | 8/2021 | Butail et al. | |
| 2022/0181158 A1 | 6/2022 | Bowes et al. | |
| 2022/0254685 A1 | 8/2022 | Ermez et al. | |
| 2022/0364232 A1 | 11/2022 | Nannapaneni et al. | |
| 2023/0130557 A1 | 4/2023 | Birru et al. | |

FOREIGN PATENT DOCUMENTS

| | | |
|---|---|---|
| CN | 101447427 A | 6/2009 |
| CN | 101540294 A | 9/2009 |
| CN | 101572291 A | 11/2009 |
| CN | 101770978 A | 7/2010 |
| CN | 101952945 A | 1/2011 |
| CN | 101970352 A | 2/2011 |
| CN | 102867953 A | 1/2013 |
| CN | 103125013 A | 5/2013 |
| CN | 105097446 A | 11/2015 |
| CN | 107768304 A | 3/2018 |
| CN | 104752339 B | 6/2019 |
| CN | 111357083 A | 6/2020 |
| EP | 0 437 110 | 7/1991 |
| EP | 1 156 132 | 11/2001 |
| EP | 1 179 838 | 2/2002 |
| JP | S5629648 A | 3/1981 |
| JP | S63274772 A | 11/1988 |
| JP | H0266399 A | 3/1990 |
| JP | H2-187031 A | 7/1990 |
| JP | H4-142061 A | 5/1992 |
| JP | H04216630 A | 8/1992 |
| JP | H5-226280 A | 9/1993 |
| JP | H7-147321 A | 6/1995 |
| JP | H07-226393 | 8/1995 |
| JP | 08-115984 | 5/1996 |
| JP | H08325735 A | 12/1996 |
| JP | 09-022896 A | 1/1997 |
| JP | 09-027596 | 1/1997 |
| JP | H10-144688 | 5/1998 |
| JP | H10-163132 | 6/1998 |
| JP | 2966406 B2 | 10/1999 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-016066 A | 1/2002 |
| JP | 2002-124488 | 4/2002 |
| JP | 2003-193233 | 7/2003 |
| JP | 2004-235456 | 8/2004 |
| JP | 2004-273764 | 9/2004 |
| JP | 2004536960 A | 12/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2008303466 A | 12/2008 |
| JP | 2009-024252 | 2/2009 |
| JP | 2009-144242 | 7/2009 |
| JP | 2009-533877 | 9/2009 |
| JP | 2009-540123 | 11/2009 |
| JP | 2010-251760 A | 11/2010 |
| JP | 2011-035366 A | 2/2011 |
| JP | 2011192680 A | 9/2011 |
| JP | 2013080891 A | 5/2013 |
| JP | 2014049747 A | 3/2014 |
| JP | 2015067869 A | 4/2015 |
| JP | 2015514160 A | 5/2015 |
| JP | 2015221940 A | 12/2015 |
| JP | 2017008412 A | 1/2017 |
| JP | 2017014615 A | 1/2017 |
| JP | 2017053024 A | 3/2017 |
| KR | 100196018 B1 | 6/1999 |
| KR | 100272523 | 12/2000 |
| KR | 20010093766 A | 10/2001 |
| KR | 20020040877 A | 5/2002 |
| KR | 10-2002-0049730 | 6/2002 |
| KR | 20030050652 A | 6/2003 |
| KR | 20040085153 A | 10/2004 |
| KR | 10-2005-0022261 | 3/2005 |
| KR | 20050054122 A | 6/2005 |
| KR | 20050068555 A | 7/2005 |
| KR | 10-2005-0087428 | 8/2005 |
| KR | 10-2006-0087844 | 8/2006 |
| KR | 10-2007-705936 | 4/2007 |
| KR | 20080001460 A | 1/2008 |
| KR | 20080015129 A | 2/2008 |
| KR | 10-2008-0036679 | 4/2008 |
| KR | 20080060012 A | 7/2008 |
| KR | 20080061978 A | 7/2008 |
| KR | 10-2008-0101745 | 11/2008 |
| KR | 10-2008-0110897 | 12/2008 |
| KR | 20090068187 A | 6/2009 |
| KR | 20090074560 A | 7/2009 |
| KR | 10-2009-0095546 | 9/2009 |
| KR | 10-2009-0103815 | 10/2009 |
| KR | 20100014714 A | 2/2010 |
| KR | 20100029952 A | 3/2010 |
| KR | 20100114856 A | 10/2010 |
| KR | 20110027607 A | 3/2011 |
| KR | 10-2011-0056494 | 5/2011 |
| KR | 20110084166 A | 7/2011 |
| KR | 20110105645 A | 9/2011 |
| KR | 10-2011-0108382 | 10/2011 |
| KR | 20130119519 A | 10/2013 |
| KR | 20140028992 A | 3/2014 |
| KR | 101495372 B1 | 2/2015 |
| KR | 20150128615 A | 11/2015 |
| KR | 20160039139 A | 4/2016 |
| KR | 102255768 B1 | 5/2021 |
| TW | 310461 | 7/1997 |
| TW | 434708 B | 5/2001 |
| TW | 452607 B | 9/2001 |
| TW | 567544 B | 12/2003 |
| TW | 200626748 A | 8/2006 |
| TW | 200710968 A | 3/2007 |
| TW | 201405781 A | 2/2014 |
| TW | 201409697 A | 3/2014 |
| TW | 201519317 A | 5/2015 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO-02101114 A1 | 12/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |
| WO | WO 2013/148880 | 10/2013 |
| WO | WO-2013148444 A1 | 10/2013 |
| WO | WO 2014/058536 | 4/2014 |
| WO | WO-2019036292 A1 | 2/2019 |
| WO | WO-2019055317 A1 | 3/2019 |

(56) References Cited

FOREIGN PATENT DOCUMENTS

OTHER PUBLICATIONS

U.S. Final Office Action, dated Nov. 5, 2014, issued in U.S. Appl. No. 13/633,502.
U.S. Notice of Allowance, dated Mar. 2, 2015, issued in U.S. Appl. No. 13/633,502.
U.S. Notice of Allowance (Supplemental Notice of Allowability), dated Apr. 16, 2015, issued in U.S. Appl. No. 13/633,502.
U.S. Office Action, dated Jan. 12, 2016, issued in U.S. Appl. No. 14/738,685.
U.S. Final Office Action, dated Jul. 25, 2016, issued in U.S. Appl. No. 14/738,685.
U.S. Notice of Allowance, dated Oct. 13, 2016, issued in U.S. Appl. No. 14/738,685.
U.S. Office Action, dated May 30, 2014, issued in U.S. Appl. No. 13/862,048.
U.S. Final Office Action, dated Oct. 16, 2014, issued in U.S. Appl. No. 13/862,048.
U.S. Notice of Allowance, dated Apr. 28, 2015, issued in U.S. Appl. No. 13/862,048.
U.S. Notice of Allowance, dated Jun. 17, 2015, issued in U.S. Appl. No. 13/862,048.
U.S. Office Action, dated May 6, 2015, issued in U.S. Appl. No. 14/135,375.
U.S. Final Office Action, dated Sep. 29, 2015, issued in U.S. Appl. No. 14/135,375.
U.S. Office Action, dated Jan. 21, 2016, issued in U.S. Appl. No. 14/135,375.
U.S. Final Office Action, dated May 31, 2016, issued in U.S. Appl. No. 14/135,375.
U.S. Notice of Allowance, dated Oct. 25, 2016, issued in U.S. Appl. No. 14/135,375.
U.S. Office Action, dated Oct. 24, 2018, issued in U.S. Appl. No. 15/415,800.
U.S. Final Office Action dated Mar. 21, 2019, issued in U.S. Appl. No. 15/415,800.
U.S. Office Action, dated Dec. 11, 2014, issued in U.S. Appl. No. 14/173,733.
U.S. Notice of Allowance, dated Jun. 2, 2015, issued in U.S. Appl. No. 14/173,733.
U.S. Office Action, dated Feb. 1, 2016, issued in U.S. Appl. No. 14/723,275.
U.S. Office Action, dated Jul. 28, 2016, issued in U.S. Appl. No. 14/723,275.
U.S. Final Office Action, dated Jan. 20, 2017, issued in U.S. Appl. No. 14/723,275.
U.S. Notice of Allowance, dated May 4, 2017, issued in U.S. Appl. No. 14/723,275.
U.S. Office Action, dated Jul. 12, 2016, issued in U.S. Appl. No. 14/723,270.
U.S. Notice of Allowance, dated Nov. 18, 2016, issued in U.S. Appl. No. 14/723,270.
U.S. Office Action, dated Jul. 20, 2017, issued in U.S. Appl. No. 15/398,462.
U.S. Notice of Allowance, dated Jan. 19, 2018, issued in U.S. Appl. No. 15/398,462.
U.S. Office Action, dated Apr. 4, 2019, issued in U.S. Appl. No. 15/958,662.
U.S. Notice of Allowance, dated Sep. 6, 2019, issued in U.S. Appl. No. 15/958,662.
U.S. Office Action, dated Jul. 17, 2002, issued in U.S. Appl. No. 09/975,074.
U.S. Notice of Allowance, dated Mar. 12, 2003, issued in U.S. Appl. No. 09/975,074.
U.S. Office Action, dated Feb. 8, 2005, issued in U.S. Appl. No. 10/649,351.
U.S. Final Office Action, dated Jul. 14, 2005, issued in U.S. Appl. No. 10/649,351.
U.S. Office Action, dated Dec. 30, 2005, issued in U.S. Appl. No. 10/649,351.
U.S. Notice of Allowance, dated Jul. 21, 2006, issued in U.S. Appl. No. 10/649,351.
U.S. Office Action, dated Jun. 22, 2004, issued in U.S. Appl. No. 10/435,010.
U.S. Notice of Allowance, dated Oct. 7, 2004, issued in U.S. Appl. No. 10/435,010.
U.S. Notice of Allowance, dated Jan. 19, 2005, issued in U.S. Appl. No. 10/435,010.
U.S. Office Action, dated Nov. 23, 2005, issued in U.S. Appl. No. 10/984,126.
U.S. Final Office Action, dated May 17, 2006, issued in U.S. Appl. No. 10/984,126.
U.S. Notice of Allowance, dated Aug. 25, 2006, issued in U.S. Appl. No. 10/984,126.
U.S. Office Action, dated Mar. 23, 2005, issued in U.S. Appl. No. 10/690,492.
U.S. Notice of Allowance, dated Sep. 14, 2005, issued in U.S. Appl. No. 10/690,492.
U.S. Office Action, dated Jun. 27, 2008, issued in U.S. Appl. No. 11/305,368.
U.S. Office Action, dated Apr. 3, 2009, issued in U.S. Appl. No. 11/305,368.
U.S. Notice of Allowance, dated Nov. 17, 2009, issued in U.S. Appl. No. 11/305,368.
U.S. Office Action, dated Jul. 12, 2005, issued in U.S. Appl. No. 10/815,560.
U.S. Final Office Action, dated Dec. 28, 2005, issued in U.S. Appl. No. 10/815,560.
U.S. Office Action, dated Apr. 17, 2006, issued in U.S. Appl. No. 10/815,560.
U.S. Office Action, dated Sep. 28, 2006, issued in U.S. Appl. No. 10/815,560.
U.S. Notice of Allowance,, dated Apr. 24, 2007, issued in U.S. Appl. No. 10/815,560.
U.S. Office Action, dated Aug. 21, 2008, issued in U.S. Appl. No. 11/265,531.
U.S. Final Office Action, dated Feb. 26, 2009, issued in U.S. Appl. No. 11/265,531.
U.S. Notice of Allowance, dated May 4, 2009, issued in U.S. Appl. No. 11/265,531.
U.S. Office Action, dated Nov. 23, 2010, issued in U.S. Appl. No. 12/538,770.
U.S. Notice of Allowance, dated Jun. 30, 2011, issued in U.S. Appl. No. 12/538,770.
U.S. Office Action, dated Oct. 16, 2008, issued in U.S. Appl. No. 11/349,035.
U.S. Final Office Action, dated Feb. 25, 2009, issued in U.S. Appl. No. 11/349,035.
U.S. Office Action, dated Jun. 4, 2009, issued in U.S. Appl. No. 11/349,035.
U.S. Final Office Action, dated Nov. 20, 2009, issued in U.S. Appl. No. 11/349,035.
U.S. Notice of Allowance, dated Mar. 2, 2010, issued in U.S. Appl. No. 11/349,035.
U.S. Office Action, dated Sep. 29, 2008, issued in U.S. Appl. No. 11/782,570.
U.S. Final Office Action, dated Apr. 28, 2009, issued in U.S. Appl. No. 11/782,570.
U.S. Notice of Allowance, dated Sep. 17, 2009, issued in U.S. Appl. No. 11/782,570.
U.S. Office Action, dated Jan. 25, 2011, issued in U.S. Appl. No. 12/636,616.
U.S. Final Office Action, dated Jun. 15, 2011, issued in U.S. Appl. No. 12/636,616.
U.S. Notice of Allowance, dated Sep. 30, 2011, issued in U.S. Appl. No. 12/636,616.
U.S. Office Action, dated Jun. 24, 2009, issued in U.S. Appl. No. 12/030,645.
U.S. Final Office Action, dated Jan. 13, 2010, issued in U.S. Appl. No. 12/030,645.

(56) References Cited

OTHER PUBLICATIONS

U.S. Final Office Action, dated Jul. 23, 2010, issued in U.S. Appl. No. 12/030,645.
U.S. Notice of Allowance and Fee Due, dated Jan. 24, 2011, issued in U.S. Appl. No. 12/030,645.
U.S. Office Action, dated Aug. 6, 2012, issued in U.S. Appl. No. 13/095,734.
Notice of Allowance dated Dec. 3, 2012, issued in U.S. Appl. No. 13/095,734.
U.S. Office Action, dated Aug. 5, 2009, issued in U.S. Appl. No. 11/951,236.
U.S. Final Office Action, dated Jan. 26, 2010 from U.S. Appl. No. 11/951,236.
U.S. Notice of Allowance, dated Apr. 6, 2010, issued in U.S. Appl. No. 11/951,236.
U.S. Office Action, dated Jun. 30, 2011, issued in U.S. Appl. No. 12/829,119.
U.S. Final Office Action, dated Nov. 17, 2011, issued in U.S. Appl. No. 12/829,119.
U.S. Office Action, dated Apr. 19, 2012, issued in U.S. Appl. No. 12/829,119.
U.S. Notice of Allowance, dated Aug. 7, 2012, issued in U.S. Appl. No. 12/829,119.
U.S. Office Action, dated Jun. 11, 2009, issued in U.S. Appl. No. 11/963,698.
U.S. Final Office Action, dated Dec. 9, 2009, issued in U.S. Appl. No. 11/963,698.
U.S. Office Action, dated Jun. 11, 2010, issued in U.S. Appl. No. 11/963,698.
U.S. Final Office Action, dated Dec. 30, 2010, issued in U.S. Appl. No. 11/963,698.
U.S. Notice of Allowance, dated Sep. 2, 2011, issued in U.S. Appl. No. 11/963,698.
U.S. Office Action, dated Apr. 16, 2012, issued in U.S. Appl. No. 13/276,170.
U.S. Notice of Allowance, dated Oct. 4, 2012, issued in U.S. Appl. No. 13/276,170.
U.S. Notice of Allowance, dated Jul. 25, 2011, issued in U.S. Appl. No. 12/363,330.
U.S. Office Action dated Oct. 21, 2009, issued in U.S. Appl. No. 12/202,126.
U.S. Final Office Action, dated May 7, 2010, issued in U.S. Appl. No. 12/202,126.
U.S. Office Action, dated Jul. 26, 2010 issued in U.S. Appl. No. 12/202,126.
U.S. Final Office Action, dated Feb. 7, 2011, issued in U.S. Appl. No. 12/202,126.
U.S. Office Action, dated Jan. 7, 2013, issued in U.S. Appl. No. 12/202,126.
U.S. Notice of Allowance, dated Jun. 7, 2013, issued in U.S. Appl. No. 12/202,126.
U.S. Office Action, dated May 3, 2010, issued in U.S. Appl. No. 12/407,541.
U.S. Final Office Action, dated Oct. 19, 2010, issued in U.S. Appl. No. 12/407,541.
U.S. Office Action, dated May 2, 2011, issued in U.S. Appl. No. 12/407,541.
U.S. Notice of Allowance, dated Sep. 19, 2011, issued in U.S. Appl. No. 12/407,541.
U.S. Office Action, dated Mar. 6, 2012, issued in U.S. Appl. No. 13/244,016.
U.S. Notice of Allowance dated Nov. 29, 2012, issued in U.S. Appl. No. 13/244,016.
U.S. Office Action, dated Jun. 14, 2011, issued in U.S. Appl. No. 12/556,490.
U.S. Notice of Allowance, dated Mar. 2, 2012, issued in U.S. Appl. No. 12/556,490.
U.S. Office Action, dated May 13, 2011, issued in U.S. Appl. No. 12/755,248.
U.S. Office Action, dated Oct. 28, 2011, issued in U.S. Appl. No. 12/755,248.
U.S. Final Office Action, dated Apr. 30, 2012, issued in U.S. Appl. No. 12/755,248.
U.S. Office Action, dated Feb. 15, 2013, issued in U.S. Appl. No. 12/755,248.
U.S. Office Action dated Dec. 18, 2012, issued in U.S. Appl. No. 12/723,532.
U.S. Office Action dated Jul. 18, 2013, issued in U.S. Appl. No. 12/723,532.
U.S. Notice of Allowance dated Dec. 24, 2013, issued in U.S. Appl. No. 12/723,532.
U.S. Office Action, dated Feb. 16, 2012, issued in U.S. Appl. No. 12/755,259.
U.S. Final Office Action, dated Sep. 12, 2012, issued in U.S. Appl. No. 12/755,259.
U.S. Notice of Allowance, dated Jul. 10, 2013, issued in U.S. Appl. No. 12/755,259.
U.S. Notice of Allowance dated Sep. 4, 2013 issued in U.S. Appl. No. 12/755,259.
U.S. Office Action, dated Dec. 18, 2014, issued in U.S. Appl. No. 14/097,160.
U.S. Final Office Action, dated Jun. 2, 2015, issued in U.S. Appl. No. 14/097,160.
U.S. Notice of Allowance, dated Sep. 9, 2015, issued in U.S. Appl. No. 14/097,160.
U.S. Office Action, dated Jul. 7, 2016, issued in U.S. Appl. No. 14/989,444.
U.S. Notice of Allowance, dated Jan. 20, 2017, issued in U.S. Appl. No. 14/989,444.
U.S. Office Action, dated May 10, 2012, issued in U.S. Appl. No. 13/020,748.
U.S. Final Office Action, dated Nov. 16, 2012, issued in U.S. Appl. No. 13/020,748.
U.S. Office Action, dated Feb. 24, 2014, issued in U.S. Appl. No. 13/020,748.
U.S. Final Office Action, dated Jul. 2, 2014, issued in U.S. Appl. No. 13/020,748.
U.S. Office Action, dated Dec. 23, 2014, issued in U.S. Appl. No. 13/851,885.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance, dated Mar. 24, 2017, issued in U.S. Appl. No. 13/851,885.
U.S. Office Action, dated Dec. 18, 2014, issued in U.S. Appl. No. 14/502,817.
U.S. Final Office Action, dated Jul. 17, 2015, issued in U.S. Appl. No. 14/502,817.
U.S. Notice of Allowance, dated Sep. 25, 2015, issued in U.S. Appl. No. 14/502,817.
U.S. Office Action, dated Sep. 2, 2016, issued in U.S. Appl. No. 14/965,806.
U.S. Final Office Action, dated Apr. 14, 2017, issued in U.S. Appl. No. 14/965,806.
U.S. Office Action, dated Sep. 11, 2017, issued in U.S. Appl. No. 14/965,806.
U.S. Office Action, dated Sep. 18, 2014, issued in U.S. Appl. No. 13/928,216.
U.S. Notice of Allowance, dated Jan. 22, 2015, issued in U.S. Appl. No. 13/928,216.
U.S. Office Action, dated Jun. 20, 2013, issued in U.S. Appl. No. 13/560,688.
U.S. Final Office Action, dated Feb. 14, 2014, issued in U.S. Appl. No. 13/560,688.
U.S. Notice of Allowance, dated Nov. 4, 2014, issued in U.S. Appl. No. 13/560,688.
U.S. Office Action, dated May 29, 2015, issued in U.S. Appl. No. 13/949,092.
U.S. Final Office Action, dated Jan. 14, 2016, issued in U.S. Appl. No. 13/949,092.

(56) References Cited

OTHER PUBLICATIONS

U.S. Office Action, dated Sep. 19, 2016, issued in U.S. Appl. No. 13/949,092.
U.S. Final Office Action, dated May 18, 2017, issued in U.S. Appl. No. 13/949,092.
U.S. Notice of Allowance, dated Jan. 12, 2018, issued in U.S. Appl. No. 13/949,092.
U.S. Office Action, dated Jun. 14, 2013, issued in U.S. Appl. No. 13/633,798.
U.S. Final Office Action, dated Nov. 26, 2013, issued in U.S. Appl. No. 13/633,798.
U.S. Notice of Allowance, dated May 23, 2014, issued in U.S. Appl. No. 13/633,798.
Taiwan Examination Report, dated Jun. 22, 2017, issued in Application No. TW 103113287.
Taiwan First Office Action [Reissued] dated Jun. 20, 2018, issued in Application No. TW 103144260.
Chinese First Office Action dated Jun. 2, 2017 issued in Application No. CN 201410856793.7.
Chinese Second Office Action dated Feb. 5, 2018 issued in Application No. CN 201410856793.7.
Chinese Third Office Action dated Oct. 8, 2018 issued in Application No. CN 201410856793.7.
Taiwan First Office Action dated Jun. 27, 2018 issued in Application No. TW 103145125.
PCT Search Report and Written Opinion, dated Jan. 19, 2005, issued in PCT/US2004/006940.
Korean First Notification of Provisional Rejection, dated Dec. 8, 2010, issued in Application No. KR 2004-0036346.
Korean Office Action, dated Jun. 13, 2011, issued in Application No. KR 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. CN 200980133560.1.
Chinese Second Office Action dated Aug. 7, 2013 issued in Application No. CN 200980133560.1.
Chinese Third Office Action dated Apr. 22, 2014 issued in Application No. CN 200980133560.1.
Chinese Fourth Office Action dated Jan. 5, 2015 issued in Application No. CN 200980133560.1.
Chinese Fifth Office Action dated May 5, 2015 issued in Application No. CN 200980133560.1.
Japanese Office Action dated Dec. 3, 2013 issued in Application No. JP 2011-525228.
Korean Office Action dated Sep. 6, 2012 issued in Application No. KR 2011-7004322.
Korean Office Action dated Jul. 19, 2013 issued in Application No. KR 2011-7004322.
Korean Office Action dated Nov. 4, 2013 issued in Application No. KR 10-2013-7027117.
Korean Office Action dated Jun. 17, 2014 issued in Application No. KR 10-2013-7027117.
Japanese Office Action dated Jun. 17, 2014 issued in Application No. JP 2010-055163.
Korean Office Action dated Mar. 21, 2013 issued in Application No. KR 10-2010-0024905.
Taiwan Office Action dated Jun. 8, 2015 issued in Application No. TW 099107504.
Korean Notification of Provisional Rejection dated Jul. 17, 2012, issued in Application No. KR 2010-0087997.
Taiwan Office Action and Search Report dated Feb. 12, 2015 issued in Application No. TW 099130354.
Taiwan Office Action (Rejection Decision) dated Oct. 28, 2015 issued in Application No. TW 099130354.
Taiwan Search Report dated Nov. 30, 2016 issued in Application No. TW 099130354.
Japanese Office Action dated Mar. 4, 2014 issued in Application No. JP 2010-093522.
Korean Office Action dated Mar. 4, 2013 in Application No. KR 2010-0035449.
Taiwan Office Action dated Dec. 27, 2014 issued in Application No. TW 099111860.
Japanese Office Action dated Jul. 29, 2014 issued in Application No. JP 2010-093544.
Korean Second Office Action dated Jan. 25, 2014 in Application No. KR 10-2010-0035453.
Korean First Office Action dated Jul. 10, 2015 issued in Application No. KR 10-2014-0090283.
Taiwan Office Action dated Aug. 4, 2015 issued in Application No. TW 099111859.
Taiwan Office Action dated Jan. 10, 2017 issued in Application No. TW 105105984.
PCT Search Report and Written Opinion, dated Apr. 13, 2020, issued in PCT/US19/66301.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Chinese First Office Action dated Mar. 18, 2016 issued in Application No. CN 201380022693.8.
Chinese Second Office Action dated Jan. 23, 2017 issued in Application No. CN 201380022693.8.
Chinese Third Office Action dated Sep. 25, 2017 issued in Application No. CN 201380022693.8.
Chinese Fourth Office Action dated Mar. 15, 2018 issued in Application No. CN 201380022693.8.
Chinese Decision of Final Rejection dated Aug. 24, 2018 issued in Application No. CN 201380022693.8.
Japanese Notification of Reasons for Rejection dated Dec. 20, 2016 issued in Application No. JP 2015-503547.
Korean First Office Action dated Apr. 18, 2019 issued in Application No. KR 10-2014-7030125.
Taiwan Office Action dated Oct. 25, 2016 issued in Application No. TW 102110947.
Taiwan Examination Report dated Dec. 26, 2016 issued in Application No. TW 102123248.
Korean First Office Action dated Aug. 30, 2019 issued in Application No. KR 10-2013-0075854.
Korean First Office Action dated Sep. 24, 2019 issued in Application No. KR 10-2013-0089834.
Taiwan Examination Report dated Oct. 26, 2016 issued in Application No. TW 102126976.
Chinese First Office Action dated Sep. 6, 2015 issued in Application No. CN 201310320848.8.
Chinese Second Office Action dated May 16, 2016 issued in Application No. CN 201310320848.8.
Taiwan Examination Report dated Oct. 26, 2016 issued in Application No. TW 102126696.
Taiwan Examination Report dated Mar. 16, 2017 issued in Application No. TW 102132433.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.

(56) References Cited

OTHER PUBLICATIONS

Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).

Elam et al. (2001) "Nucleation and Growth During Tungsten Atomic Layer Deposition on $SiO_2$ Surfaces," *Thin Solid Films*, 13pp.

Fair, James A. (1983) Presentation by Inventor "Chemical Vapor Deposition of Refractory Metal Silicides," *GENUS Incorporated*, 27 pp.

George et al. (1996) "Surface Chemistry for atomic Layer Growth", *J. Phys. Chem*, 100(31):13121-13131.

Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], *Materials Transactions*, 43(7):1585-1592.

Hoover, Cynthia (Jul. 2007) "Enabling Materials for Contact Metallization," *Praxair Electronic Materials R&D*, pp. 1-16.

Klaus et al. (2000) "Atomic layer deposition of tungsten using sequential surface chemistry with a sacrificial stripping reaction," *Thin Solid Films* 360:145-153.

Klaus et al. (2000) "Atomically Controlled Growth of Tungsten and Tungsten Nitride Using Sequential Surface Reactions," *Applied Surface Science*, pp. 162-163, 479-491.

Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.

Lai, Ken K. and Lamb, H. Henry (1995) "Precursors for Organometallic Chemical Vapor Deposition of Tungsten Carbide Films," *Chemistry Material*, 7(12):2284-2292.

Lee et al. (Jan. 21, 2003) "Pulsed Deposition of Ultra Thin Tungsten and its Application for Plugfill of High Aspect Ratio Contacts," Abstract, 1 page.

Li et al. (2002) "Deposition of $WN_xC_y$ Thin Films by ALCVD™ Method for Diffusion Barriers in Metallization," *IITC Conference Report*, 3 pp.

Manik. P, et al. (2012) "Fermi-level unpinning and low resistivity in contacts to n-type Ge with a thin ZnO interfacial layer," *App. Phys. Lett.* 101:182105-5.

Saito et al. (2001) "A Novel Copper Interconnection Technology Using Self Aligned Metal Capping Method," *IEEE*, 3pp.

Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.

U.S. Appl. No. 13/758,928, filed Feb. 4, 2013, Humayun et al.

Aldjapan.com "Principle—ALD Japan, Inc." [webpage] pp. 1-10. [retrieved from URL: https://aldjapan.com/%E5%8E%9F%E7%90%86/].

Anonymous, "Lam Research enables next-generation memory with industry's first ALD process for low-fluorine tungsten fill" Semiconductor Digest News and Industry Trends for Solid State Technology, Aug. 2016, 2 Pages.

Chinese First Office Action dated Oct. 27, 2020 issued in Application No. CN 201811491805.5.

CN Office Action dated Feb. 14, 2023 in Application No. CN202080037670.4 with English translation.

CN Office Action dated Mar. 30, 2023, in Application No. CN202080027971.9 with English translation.

CN Office Action dated Oct. 11, 2022, in Application No. CN201910418672.7 with English translation.

Coventor Brochure "3D NAND: Challenges Beyond 96-Layer Memory Arrays", Oct. 12, 2018, pp. 1-4.

Dominique, S. et al., "An alternative to Tungsten in 3D-NAND technology", IEEE International Interconnect Technology Conference (IITC), 2021, pp. 1-3.

Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya-ku Kanagawa 240, 8501, Japan.

International Preliminary Report on Patentability and written opinion dated Sep. 15, 2022, in PCT Application No. PCT/US2021/020748.

International Preliminary Report on Patentability dated Dec. 2, 2021, issued in PCT/US2020/033461.

International Preliminary Report on Patentability dated Feb. 9, 2023 in PCT Application No. PCT/US2020/070325.

International Preliminary Report on Patentability dated Feb. 24, 2022 in PCT Application No. PCT/US2020/070394.

International Preliminary Report on Patentability dated Jun. 24, 2021 issued in Application No. PCT/US2019/066301.

International Preliminary Report on Patentability dated Nov. 12, 2020 in Application No. PCT/US2019/030712.

International Preliminary Report on Patentability dated Oct. 21, 2021, in application No. PCT/US2020/027107.

International Search Report and Written Opinion dated Apr. 27, 2021 in PCT Application No. PCT/US2020/070325.

International Search Report and Written Opinion dated Aug. 19, 2019 in Application No. PCT/US2019/030712.

International Search Report and Written Opinion dated Jul. 24, 2020 issued in Application No. PCT/US2020/027107.

International Search Report and Written Opinion dated Jun. 18, 2021, in PCT Application No. PCT/US2021/020748.

International Search Report and Written Opinion dated Nov. 27, 2020, in PCT Application No. PCT/US2020/070394.

International Search Report and Written Opinion dated Sep. 4, 2020 in PCT Application No. PCT/US2020/033461.

Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.

Japanese First Office Action dated Jun. 24, 2020 issued in Application No. JP 2016-105216.

Japanese First Office Action dated Jun. 3, 2020 issued in Application No. JP 2016-104837.

Japanese Office Action dated Feb. 14, 2023 issued in Application No. JP2020-508312 with English translation.

Japanese Second Office Action dated Apr. 5, 2021 issued in Application No. JP 2016-104837.

Japanese Second Office Action dated Mar. 3, 2021 issued in Application No. JP 2016-105216.

Johnson, R.W., Hultqvist, A., Bent, S.F., "A brief review of atomic layer deposition: from fundamentals to applications", Materials today, (Jun. 1, 2014), 17(5):236-46.

JP Office Action dated Jul. 19, 2022, in Application No. JP2020-508312 with English translation.

JP Office Action dated Jun. 6, 2023 in Application No. JP2020561743 With English translation.

JP Office Action dated May 31, 2022, in Application No. JP2016-104837 with English translation.

JP Office Action dated Nov. 24, 2021, in Application No. JP20160104837 with English translation.

Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.

Kim, S. et al., "Effects of $B_2H_6$ Pretreatment on ALD of W Film Using a Sequential Supply of $WF_6$ and $SiH_4$", Electrochemical and Solid-State Letters, The Electrochemical Society, 2005, vol. 8, No. 10, pp. C155-C159.

Korean Decision for Grant dated Apr. 7, 2020 issued in Application No. KR 10-2020-7000199.

Korean Decision for Grant dated Nov. 5, 2021 issued in Application No. KR 10-2014- 0192527.

Korean Final Rejection dated Jun. 30, 2021 issued in Application No. KR 10-2014-0192527.

Korean Final Rejection Office Action dated Apr. 27, 2021 issued in Application No. KR 10-2016-0064157.

Korean First Office Action dated Aug. 2, 2021, issued in Application No. KR 10-2014-0184759.

(56) References Cited

OTHER PUBLICATIONS

Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Oct. 21, 2019 issued in Application No. KR 10-2013-0108151 with English translation.
Korean Office Action dated Jul. 28, 2021 issued in Application No. KR 10-2016-0064157.
Korean Office Action dated Jun. 21, 2021 issued in Application No. KR 10-2020-0124056.
Korean Office Action dated Jun. 28, 2020 issued in Application No. KR 10-2020-0141428.
Korean Office Action dated Nov. 30, 2020 issued in Application No. KR 10-2020-0141428.
Korean Second Office Action dated Apr. 7, 2020 issued in Application No. KR 10-2013-0075854.
Korean Second Office Action dated Mar. 11, 2020 issued in Application No. KR 10-2013-0108151.
Korean Third Office Action dated Jun. 25, 2020 issued in Application No. KR 10-2013-0108151.
Korean Third Office Action dated Jun. 29, 2020 issued in Application No. KR 10-2013-0075854.
KR Office Action dated Dec. 14, 2021, in application No. 20210063953 with English translation.
KR Final Rejection dated Oct. 5, 2021, in application No. KR1020200141428 with English translation.
KR Office Action dated Apr. 19, 2022, in application No. KR20140184759 with English Translation.
KR Office Action dated Dec. 1, 2022, in Application No. KR10-2022-0088685 with English translation.
KR Office Action dated Dec. 6, 2022, in Application No. KR10-2022-0106634 with English translation.
KR Office Action dated Feb. 11, 2023 in Application No. KR10-2016-0064757 with English translation.
KR Office Action dated Feb. 16, 2022, in Application No. KR1020160064157 with English translation.
KR Office Action dated Jan. 11, 2022, in KR Application No. 10-2022-0000825 with English translation.
KR Office Action dated Jun. 23, 2022, in Application No. KR10-2022-0015236 with English translation.
KR Office action dated May 25, 2022, in Application No. KR20210063953 with English Translation.
Lee, B. et al., "ALD Tungsten Solves Capacity Challenges in 3D NAND Device Manufacturing", Lam Brochure, Jan. 2019, pp. 1-4.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Taiwanese First Office Action dated Nov. 13, 2019 issued in Application No. TW 105116371.
Taiwanese First Office Action dated Nov. 25, 2019 issued in Application No. TW 105116363.
Taiwanese Second Office Action dated Aug. 19, 2020 issued in Application No. TW 105116371.
Taiwanese Third Office Action dated Mar. 16, 2021 issued in Application No. TW 105116371.
TW Office Action dated Feb. 21, 2022, in Application No. TW107128141 with English translation.
U.S. Corrected Notice of Allowance dated May 5, 2022 in U.S. Appl. No. 16/638,430.
U.S. Non-Final Office Action dated Dec. 15, 2021 in U.S. Appl. No. 17/250,014.
U.S. Non-Final Office Action dated Jul. 7, 2023, in U.S. Appl. No. 17/633,562.
U.S. Non-Final Office Action dated Sep. 21, 2021, in U.S. Appl. No. 16/638,430.
U.S. Notice of Allowance dated Jan. 25, 2022, in U.S. Appl. No. 16/638,430.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
U.S. Office Action Restriction/Election dated Sep. 9, 2021 issued in U.S. Appl. No. 17/250,014.
U.S. Appl. No. 17/907,959, inventors Birru et al., filed Aug. 29, 2022.
U.S. Appl. No. 18/003,137, inventors Schloss et al., filed Dec. 22, 2022.
U.S. Restriction requirement dated Apr. 20, 2023 in U.S. Appl. No. 17/633,562.
U.S. Restriction requirement dated Jun. 15, 2023 in U.S. Appl. No. 17/601,918.
U.S. Supplemental Notice of Allowance dated Dec. 14, 2022 in U.S. Appl. No. 17/250,014.
Wikipedia "Atomic layer deposition" [webpage] Mar. 25, 2020, pp. 1-9. retrieved from, URL: https://ja.wikipedia.org/w/index.php?title= Atomic Layer Deposition & oldid=76757564.
JP Office Action dated Jan. 30, 2024 in JP Application No. JP2021-533642, with English Translation.

\* cited by examiner

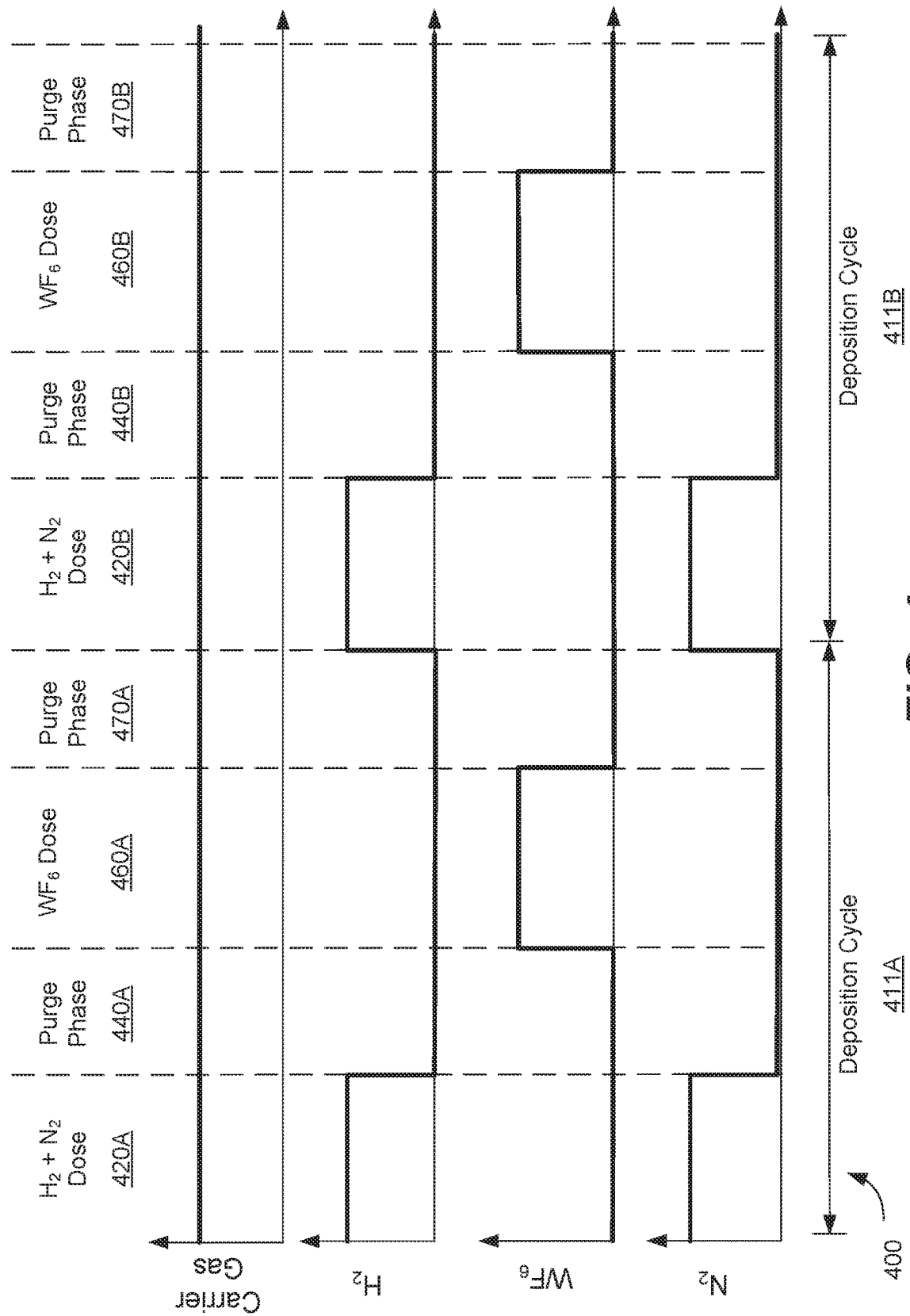

ATOMIC LAYER DEPOSITION ON 3D NAND STRUCTURES

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of tungsten-containing materials is an integral part of many semiconductor fabrication processes. These materials may be used for horizontal interconnects, vias between adjacent metal layers, and contacts between metal layers and devices. However, as devices shrink and more complex patterning schemes are utilized in the industry, deposition of thin tungsten films becomes a challenge. Deposition in complex high aspect ratio structures such as 3D NAND structures is particularly challenging.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method including providing a structure to be filled with a tungsten-containing material and exposing the structure to multiple deposition cycles, where each deposition cycle includes sequentially delivering a dose of hydrogen ($H_2$) co-flowed with nitrogen ($N_2$) and a dose of a tungsten precursor to a chamber housing the structure.

In some embodiments, the structure is a partially fabricated three-dimension (3-D) NAND structure including sidewalls and a plurality of openings in the sidewalk leading to a plurality of features having a plurality of interior regions fluidically accessible through the openings. In some embodiments, the dose of the tungsten precursor is delivered at a pressure of at least 300 Torr. In some embodiments, the dose of the tungsten precursor is delivered without nitrogen. In some embodiments, the $N_2$ is between 10-30% (vol.) of the total $N_2+H_2$ flow. In some embodiments, the substrate temperature is no more than 350° C. during the dose of $H_2$ co-flowed with $N_2$. In some embodiments, the $N_2$ is greater than 30% (vol) of the total $N_2+H_2$ flow and the substrate temperature is at least 375° C. during the dose of $H_2$ co-flowed with $N_2$. In some embodiments, the tungsten precursor is tungsten hexafluoride. In some embodiments, the tungsten precursor is a chlorine-containing tungsten precursor, in some embodiments, the dose of the tungsten precursor is delivered at a higher pressure than the dose of the $H_2$ co-flowed with $N_2$.

Another aspect of the disclosure relates to a method including: providing a structure having gaps to be filled with a tungsten-containing material; exposing the structure to multiple deposition cycles, where each deposition cycle includes sequentially delivering a dose of hydrogen ($H_2$) and a dose of a tungsten precursor to deposit a bulk tungsten film in the gaps; and forming a cap layer on the bulk layer.

In some embodiments, the structure is a partially fabricated three-dimension (3-D) NAND structure including sidewalls and a plurality of openings in the sidewalls leading to the gaps to be filled with tungsten. In some embodiments, the cap layer is a tungsten oxide layer. In some embodiments, the cap layer is an amorphous tungsten layer. In some embodiments, the structure is provided to a multi-station deposition chamber and where the multiple deposition cycles are performed in one or more first stations of the multi-station deposition chamber and the cap layer is formed in one or more second station of the multi-station deposition chamber. In some embodiments, the cap layer is deposited on the sidewalls.

A further aspect of the disclosure relates to a method including: (a) depositing a tungsten nucleation layer in a feature on a substrate by alternating pulses of a tungsten precursor and a boron-containing reducing agent; (b) depositing a tungsten template layer on the tungsten nucleation layer by alternating pulses of a tungsten precursor and hydrogen ($H_2$) at a substrate temperature between 250° C. and 350° C.; (c) after (b), raising the substrate temperature by at least 50° C., and (d) after (c), depositing a tungsten bulk layer by alternating pulses of a tungsten precursor and hydrogen (H2) at a substrate temperature of at least 350° C. In some embodiments, the tungsten nucleation layer is deposited to a thickness of no more than 30 Angstroms.

Yet another aspect of the disclosure relates to an apparatus including: a process chamber having one or more stations each configured to hold a substrate; one or more process gas inlets for coupling to a hydrogen ($H_2$) gas source, a nitrogen ($N_2$) gas source, and a tungsten precursor gas source; and a controller for controlling operations in the apparatus, including machine-readable instructions for sequentially delivering a dose of hydrogen ($H_2$) co-flowed with a nitrogen ($N_2$) and a dose of a tungsten precursor to the process chamber.

These and other aspects are described further below with reference to the drawings.

BRIEF DESCRIPTION OF THE DRAWINGS

FIG. 4 is a timing sequence diagram showing example cycles in methods for depositing films in accordance with certain disclosed embodiments.

DETAILED DESCRIPTION

Figures 1A, 1B:
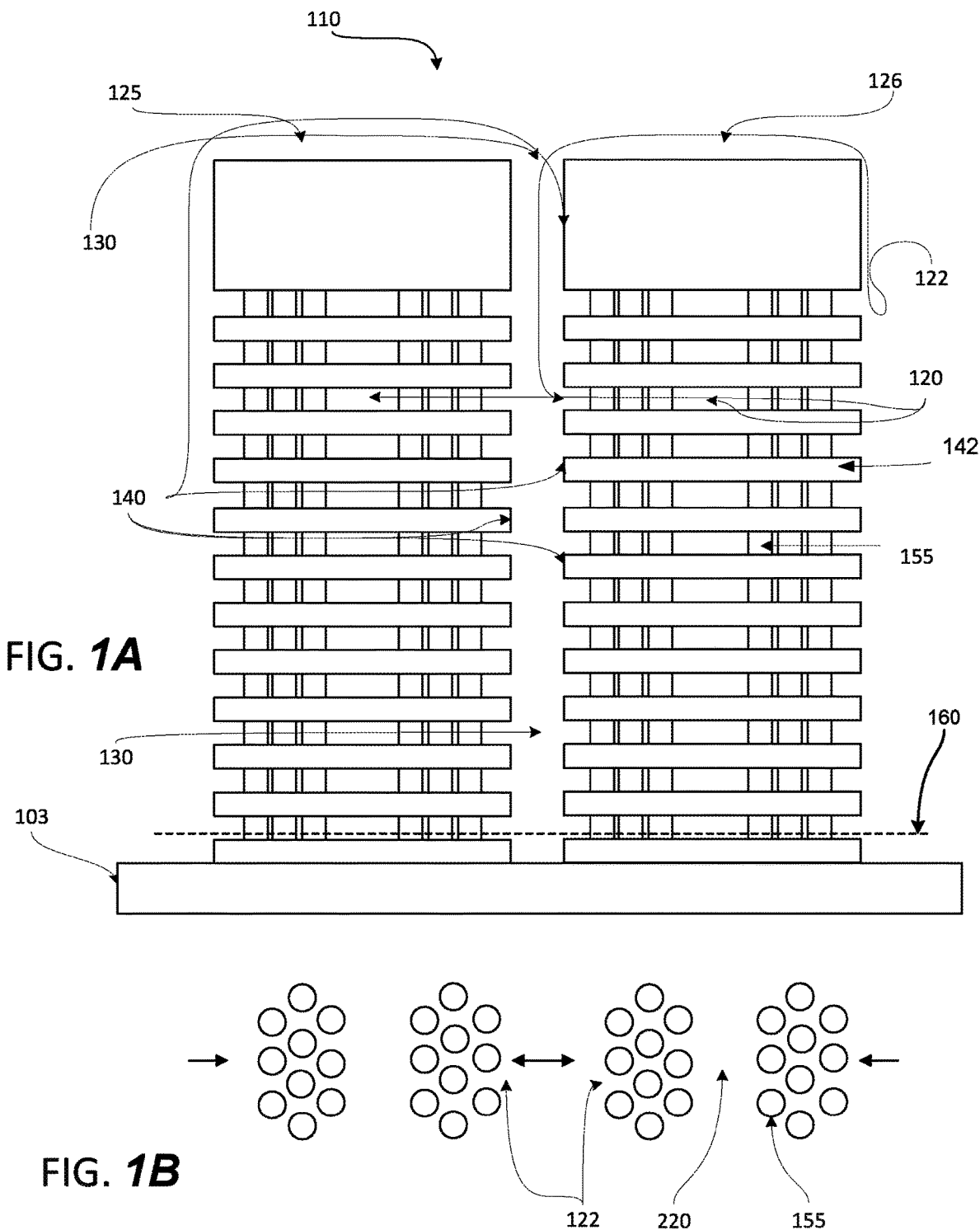
FIG. 1A presents a cross-sectional side-view of a 3-D NAND structure that may be filled with tungsten according to the embodiments described herein.
FIG. 1B presents a cross-sectional top-down view of the -D NAND in FIG. 1A.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten (W) fill of features is often used in semiconductor device fabrication to form electrical contacts. In conventional methods of depositing tungsten films, a nucleation tungsten layer is first deposited into a via or contact. In general, a nucleation layer is a thin conformal layer that serves to facilitate the subsequent formation of a bulk material thereon. The tungsten nucleation layer may be deposited to conformally coat the sidewalk and bottom of the feature. Conforming to the underlying feature bottom and sidewalls can be critical to support high quality deposition. Nucleation layers are often deposited using atomic layer deposition (ALD) or pulsed nucleation layer (PNL) methods.

In an ALD or PNL technique, pulses of reactant are sequentially injected and purged from the reaction chamber, typically by a pulse of a purge gas between reactants. A first reactant can be adsorbed onto the substrate, available to react with the next reactant. The process is repeated in a cyclical fashion until the desired thickness is achieved. In the context of the disclosed embodiments, chemical vapor deposition (CVD) embodies processes in which reactants are together introduced to a reactor for a vapor-phase or surface reaction. PNL and ALD processes are distinct from CVD processes and vice versa.

After the tungsten nucleation layer is deposited, bulk tungsten may be deposited by a CVD process by reducing tungsten hexafluoride ($WF_6$) using a reducing agent such as hydrogen ($H_2$). Bulk tungsten is different from a tungsten nucleation layer. Bulk tungsten as used herein refers to tungsten used to fill most or all of a feature, such as at least about 50% of the feature. Unlike a nucleation layer, which is a thin conformal film that serves to facilitate the subsequent formation of a bulk material thereon, bulk tungsten is used to carry current. It may be characterized by larger grain size and lower resistivity as compared to a nucleation film. In various embodiments, bulk tungsten is tungsten deposited to a thickness of at least 50 Å.

There are various challenges in tungsten fill as devices scale to smaller technology nodes and more complex patterning structures are used. One challenge is conformal deposition in these structures such that there is an even distribution of material throughout the structure. Distribution of a material within a feature or structure may be characterized by its step coverage. For the purposes of this description, "step coverage" is defined as a ratio of two thicknesses. For example, step coverage can be the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening.

Another challenge is reducing the fluorine concentration or content in the deposited tungsten film. As compared to larger features, a smaller feature having the same fluorine concentration in the tungsten film as a larger feature affects the performance of the device more substantially. For example, the smaller the feature, the thinner the films are deposited. As a result, fluorine in the deposited tungsten film is more likely to diffuse through the thinner films, thereby potentially causing device failure. For structures such as 3D NAND structures, sidewall roughness is also a challenge.

The methods and apparatuses provided herein may have one or more of the following advantages. In some implementations, they provide tungsten deposition having reduced roughness. They may do so by providing smoother growth and without an intervening etch operation. Low fluorine tungsten may be deposited. Further, the methods may provide good step coverage. The disclosed embodiments have a wide variety of applications including depositing tungsten into 3D NAND structures.

The methods described herein are performed on a substrate that may be housed in a chamber. The substrate may be a silicon or other semiconductor water, e.g., a 200-mm wafer, a 300-mm wafer, or a 450-mm wafer, including wafers having one or more layers of material, such as dielectric, conducting, or semi-conducting material deposited thereon. The methods are not limit to semiconductor substrates, and may be performed to fill any feature with metal such as tungsten.

FIG. 1A presents a cross-sectional side-view of a 3-D NAND (also referred to as vertical NAND or VNAND) structure 110 (formed on a semiconductor substrate 103) having VNAND stacks (left 125 and right 126), central vertical structure 130, and a plurality of stacked horizontal features 120 with openings 122 on opposite sidewalls 140 of central vertical structure 130. Note that FIG. 1F displays two stacks 125 and 126 of the exhibited 3-D NAND structure 110, which together form the trench-like central vertical structure 130, however, in certain embodiments, there may be more than two stacks arranged in sequence and running spatially parallel to one another, the gap between each adjacent pair of stacks forming a central vertical structure 130, like that explicitly illustrated in FIG. 1A. In the example of FIG. 1A, the horizontal features 120 are 3-D memory wordline features that are fluidically accessible from the central vertical structure 130 through the openings 122. Although not explicitly indicated in the figure, the horizontal features 120 present in both the 3-D NAND stacks 125 and 126 shown in FIG. 1A (i.e., the left 3-D NAND stack 125 and the right 3-D NAND stack 126) are also accessible from the other sides of the stacks (far left and far right, respectively) through similar vertical structures formed by additional 3-D NAND stacks (to the far left and far right, but not shown). In other words, each 3-D NAND stack 125, 126 contains a stack of wordline features that are fluidically accessible from both sides of the 3-D NAND stack through a central vertical structure 130.

The wordline features in a 3-D NAND stack are typically formed by depositing an alternating stack of silicon oxide and silicon nitride layers, and then selectively removing the nitride layers leaving a stack of oxide layers 142 having gaps between them. These gaps are the wordline features. Any number of wordlines may be vertically stacked in such a 3-D NAND structure so long as there is a technique for forming them available, as well as a technique available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points).

FIG. 1B presents a cross-sectional top-down view of the same 3-D NAND structure 110 shown in side-view in FIG. 1A with the cross-section taken through the horizontal section 160 as indicated by the dashed horizontal line in FIG. 1A. The cross-section of FIG. 1G illustrates several rows of pillars 155, which are shown in FIG. 1A to run vertically from the base of semiconductor substrate 103 to the top of 3-D NAND stack 110. In some embodiments, these pillars 155 are formed from a polysilicon material and are structurally and functionally significant to the 3-D NAND structure 110. In some embodiments, such polysilicon pillars may serve as gate electrodes for stacked memory cells formed within the pillars. The top-view of FIG. 1B illustrates that the pillars 155 form constrictions in the openings 122 to wordline features 120—i.e. fluidic accessibility of wordline features 120 from the central vertical structure 130 via openings 122 (as indicated by the arrows in FIG. 1G) is inhibited by pillars 155. In some embodiments, the size of the horizontal gap between adjacent polysilicon pillars is between about 1 and 20 nm. This reduction in fluidic accessibility increases the difficulty of uniformly filling wordline features 120 with tungsten material.

Figure 2A:
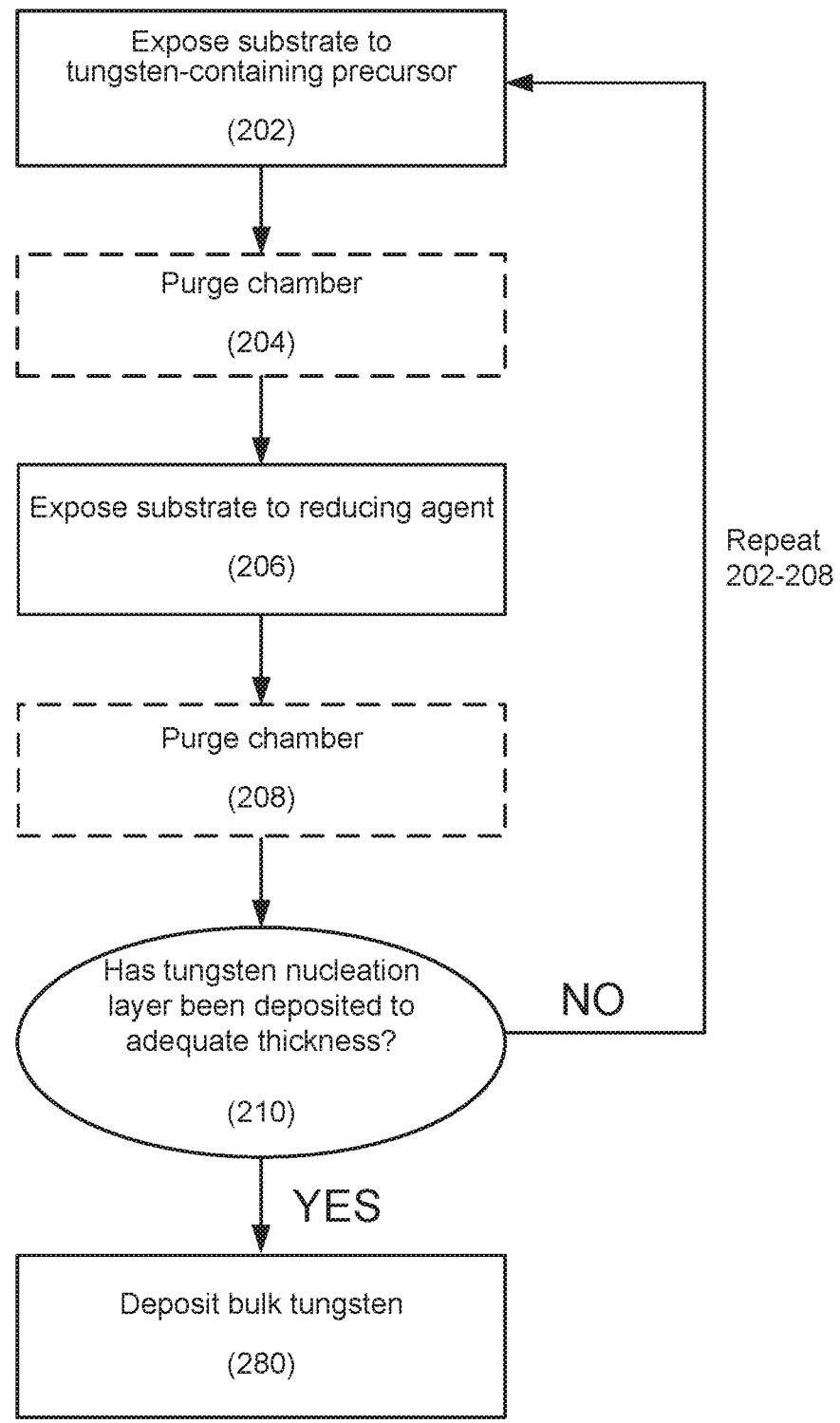
FIGS. 2A and 2B are process flow diagrams depicting operations for methods in accordance with certain disclosed embodiments.
Figure 2B:
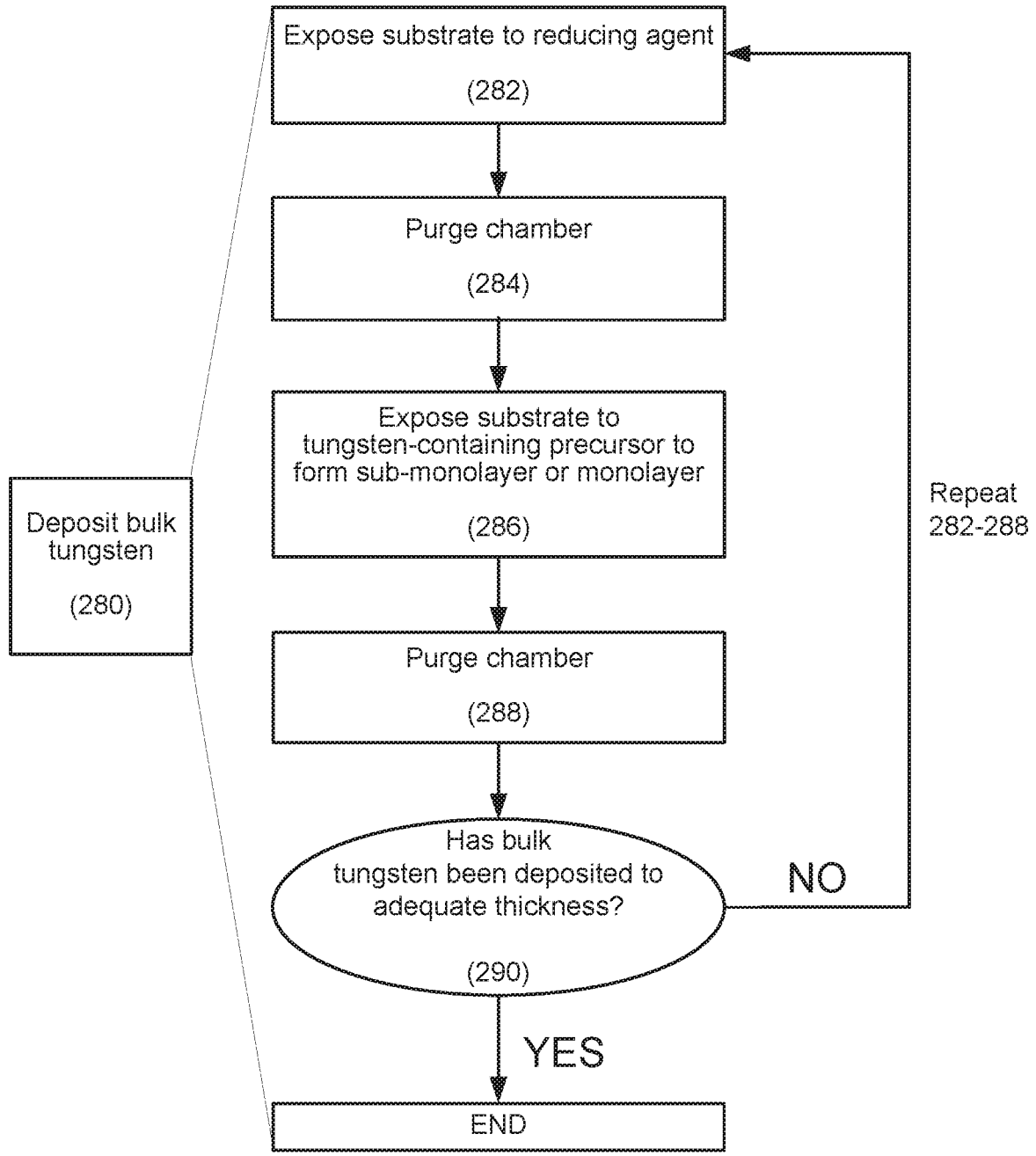
Figure 2C:
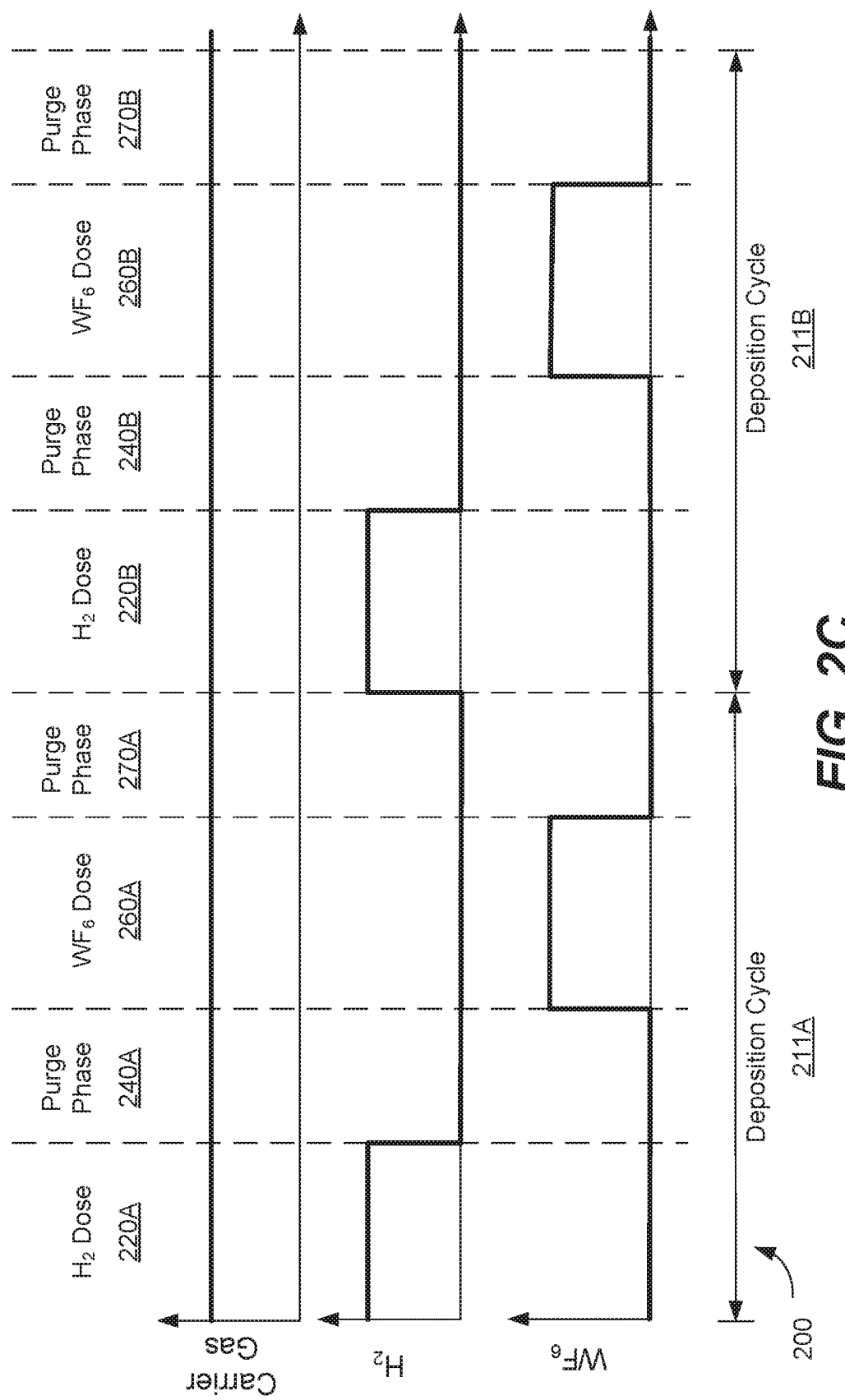
FIG. 2C is a timing sequence diagram showing example cycles in methods for depositing films in accordance with certain disclosed embodiments.

FIGS. 2A-2C describe methods that may be performed to fill a 3D NAND structure with low-fluorine and low resistivity tungsten, Turning first to FIG. 2A, operations 202-210 of FIG. 2A are performed to deposit a tungsten nucleation layer by ALD. In various embodiments described herein, operations 202-210 are performed at lower pressure than the subsequent bulk deposition in operation 280, For example, operations 202-210 may be performed at a low pressure less than about 10 Torr. In some examples, operations 202-210 are performed at a pressure of about 10 Torr, or a pressure of about 3 Torr.

In some implementations, performing operations 202-210 at a low pressure reduces fluorine concentration in the deposited tungsten film due to a lower partial pressure of a fluorine-containing precursor in the chamber when the film is deposited, such that less fluorine is incorporated into the film.

In operation 202, the substrate is exposed to a tungsten-containing precursor such as $WF_6$. For purposes of the description herein, although $WF_6$ is used as an example of a tungsten-containing precursor, it should be understood that other tungsten-containing precursors may be suitable for performing disclosed embodiments. For example, a metal-organic tungsten-containing precursor may be used. Organometallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Tungsten chlorides ($WCl_x$) and tungsten hexacarbonyl $W(CO)_6$ The tungsten-containing precursor may include a combination of these compounds. In some embodiments, a carrier gas, such as nitrogen ($N_2$), argon (Ar), helium (He), or other inert gases, may be flowed during operation 202.

Operation 202 may be performed for any suitable duration and at any suitable temperature. In some examples, operation 202 may be performed for a duration between about 0.25 seconds and about 30 seconds, about 0.25 seconds to about 5 seconds, or about 0.5 seconds to about 3 seconds. This operation may be performed in some embodiments for a duration sufficient to saturate the active sites on the surface of the substrate.

In operation 204, the chamber is optionally purged to remove excess $WF_6$ that did not adsorb to the surface of the substrate. A purge may be conducted by flowing an inert gas at a fixed pressure thereby reducing the pressure of the chamber and re-pressurizing the chamber before initiating another gas exposure.

In operation 206, the substrate is exposed to a reducing agent to deposit a tungsten nucleation layer. The reducing agent may be a borane, silane, or germane. Example boranes include borane ($BH_3$), diborane ($B_2H_6$), triborane, alkyl boranes, aminoboranes, carboboranes, and haloborane. Example silanes include silane ($SiH_4$), disilane ($Si_2H_6$), trisilane ($Si_3H_8$), alkyl silanes, aminosilanes, carbosilanes, and halosilane. Germanes include $Ge_nH_{n+4}$, $Ge_nH_{n+6}$, and $Ge_nH_m$, where n is an integer from 1 to 10, and n is a different integer than m. Other germanes may also be used, e.g., alkyl germanes, aminogermanes, carbogermanes, and halogermanes. In general, halogermanes may not have significant reducing potential but there may be process conditions and tungsten-containing precursors suitable for film formation using halogermanes.

Operation 206 may be performed for any suitable duration. In some examples, Example durations include between about 0.25 seconds and about 30 seconds, about 025 seconds to about 5 seconds, or about 0.5 seconds to about 3 seconds. In some embodiments, this operation may be sufficient to react with the adsorbed layer of $WF_6$ on the surface of the substrate. Operation 206 may be performed for a duration outside of these example ranges. In some embodiments, a carrier gas may be used, such as, for example, argon (Ar), helium (He), or nitrogen ($N_2$).

After operation 208, there may be an optional purge step to purge excess reducing agent still in gas phase that did not react with $WF_6$ on the surface of the feature. A purge may be conducted by flowing an inert gas at a fixed pressure thereby reducing the pressure of the chamber and re-pressurizing the chamber before initiating another gas exposure.

In operation 210, it is determined whether the tungsten nucleation layer has been deposited to an adequate thickness. If not, operations 202-208 are repeated until a desired thickness of a tungsten nucleation layer is deposited on the surface of the feature. Each repetition of operations 202-208 may be referred to as an ALD "cycle." In some embodiments, the order of operations 202 and 206 may be reversed, such that reducing agent is introduced first.

After the tungsten nucleation layer is deposited to an adequate thickness, in operation 280, bulk tungsten is deposited as described below. In various embodiments, operation 280 may be performed at a pressure greater than the pressure during operations 202-210. For example, operation 280 may be performed at a pressure greater than or equal to about 10 Torr, for example about 10 Torr, or about 40 Torr. In some embodiments, the pressure during both the nucleation layer and bulk layer deposition may be about 5-20 Torr, or 10 Torr.

FIG. 2B provides a process flow diagram for operations that may be performed during operation 280. Note that operations of FIG. 2B may be performed without performing operations of FIG. 2A. FIG. 2C provides a timing sequence diagram depicting examples cycles of ALD in a process 200.

In FIG. 2B, in operation 282, the substrate is exposed to a reducing agent, such as $H_2$. This operation may be referred to as a "pulse" or a "dose," which may be used interchangeably herein. $H_2$ is pulsed without flowing another reactant. In some embodiments, a carrier gas may be flowed. The carrier gas may be any of those described above with respect to operation 204 in FIG. 2A. Operation 282 may be performed for any suitable duration. In some examples, Example durations include between about 0.25 seconds and about 30 seconds, about 0.25 seconds to about 5 seconds, or about 0.5 seconds to about 3 seconds.

FIG. 2C shows $H_2$ dose 220A in deposition cycle 211A which may correspond with operation 282 of FIG. 2B. During a $H_2$ dose 220A, a carrier gas is flowed, the reducing agent is pulsed, and $WF_6$ flow is turned off.

Returning to FIG. 2B, in operation 284, the chamber is purged. This purge operation may remove excess $H_2$ that remained in gas phase. A purge is conducted by flowing an inert gas at a fixed pressure thereby reducing the pressure of the chamber and re-pressurizing the chamber before initiating another gas exposure. The chamber may be purged for any suitable duration, for example, for a duration between about 0.1 seconds and about 3 seconds. Operation 284 of FIG. 2B may correspond to purge phase 240A of FIG. 2C. As shown in FIG. 2C, during purge phase 240A, the carrier gas is flowed but $H_2$ flow and $WF_6$ flow are turned off.

Returning to FIG. 2B, in operation 286, the substrate is exposed to a tungsten-containing precursor (e.g., $WF_6$) to form a sub-monolayer or monolayer of film on the substrate. In various embodiments, $WF_6$ is flowed to the chamber during this operation for a duration between about 0.1 seconds and about 3 seconds, or about 0.5 seconds. In some embodiments, $WF_6$ may be diverted to fill the gas line and line change before dosing. In some embodiments, $WF_6$ is flowed to the chamber but does not fully react with all $H_2$ molecules on the surface of the substrate. Operation 286 may correspond to $WF_6$ dose 260A in FIG. 2C. As shown in FIG. 2C, during the $WF_6$ dose 260A, the carrier gas is flowed, the $H_2$ flow is turned off, and the $WF_6$ flow is turned on.

In operation 288 of FIG. 2B, the chamber is purged to remove reacted byproducts and $WF_6$ in gas phase from the chamber. In some embodiments, the purge duration is between about 0.1 seconds and about 2 seconds and may prevent removing all of the $WF_6$ from the substrate surface due to the low adsorption rate of $WF_6$ to a surface of tungsten. In some embodiments, purge duration is between about 0.1 seconds and about 15 seconds, such as about 7 seconds. For example, for fabrication of a 3D NAND structure, the chamber may be purged for about 7 seconds during operation 288. The purge duration depends on the substrate and stress.

Operation 288 of FIG. 2B may correspond to purge phase 270A of FIG. 2C. As shown in FIG. 2C, purge phase 270A concludes deposition cycle 211A. In some embodiments, operations 286 and 282 may be reversed such that operation 286 is performed before 282. In some embodiments, operation 282 may be performed before operation 286.

In operation 290 of FIG. 2B, it is determined whether bulk tungsten has been deposited to an adequate thickness. If not, operations 282-288 are repeated until a desired thickness is deposited. In some embodiments, operations 282-288 are repeated until a feature is filled. In FIG. 2C, it is determined that bulk tungsten has not been deposited to an adequate thickness, so operations 282-288 of FIG. 2B are repeated in deposition cycle 211B, such that an $H_2$ dose 220B is performed, followed by a purge phase 240B. A $WF_6$ dose 260B is performed, followed by another purge phase 270B.

Disclosed embodiments may have various applications in tungsten deposition processes. For example, in some embodiments, a feature may be filled by depositing a tungsten nucleation layer by ALD cycles of alternating pulses of a reducing agent (e.g., a borane, a silane, or a germane) and $WF_6$, followed by bulk tungsten deposition by using ALD cycles of alternating pulses of $H_2$ and $WF_6$. In some embodiments, a tungsten nucleation layer may be omitted with bulk deposition as described above with reference to FIGS. 2B and 2C performed directly on an underlying feature or layer. Tungsten films deposited using disclosed embodiments have low fluorine concentrations, low stress, good step coverage, and low resistivity.

Figure 3:
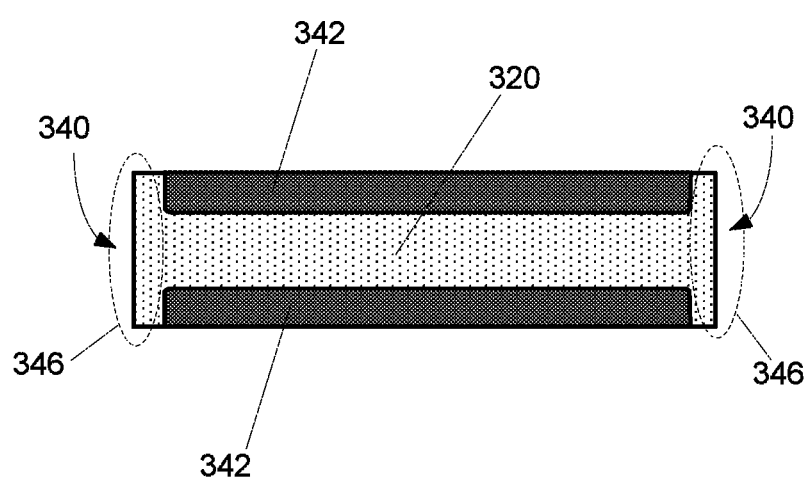
FIG. 3 presents a cross-sectional side-view of a filled wordline feature of a 3D-NAND structure.

In some aspects, the methods described herein provide smooth films having low roughness. In a 3D NAND structure, for example, the sidewalk 140 of the 3D NAND stacks 125, 126 will have tungsten at the opening of each tungsten wordline deposited at each horizontal feature 120. This is shown at 346 for a single wordline 320 in FIG. 3. The tungsten at 346 lines the sidewalk 340 of the stack that includes the wordline 320 and oxide layers 342 and is etched back in subsequent processing. However, sidewall roughness can lead to an uneven profile after etch-back and can eventually lead to etch chemical diffusing into wordline and device failure.

While CVD techniques can result in smooth sidewall coverage, the step coverage and conformality within the feature can be lacking. Provided herein are ALD methods that result in low roughness that may be implemented with the processes described above with reference to FIGS. 2A-2C. The ALD methods described herein can reduce the surface diffusion of W adatoms that leads to faceting and roughness outside of gaps, such in 3D-NAND central trenches.

In some embodiments, the methods involve co-flowing nitrogen ($N_2$) with the reducing agent in operation 282 of FIG. 2B, FIG. 4 provides a timing sequence diagram depicting examples cycles of ALD in a process 400. The timing sequence diagram is similar to that in FIG. 2B, with the addition of co-flowing $N_2$ during the H dose. In particular, FIG. 4 shows $H_2+N_2$ dose 420A in deposition cycle 411A which may correspond with operation 282 of FIG. 2B. During a $H_2$ dose 420A, a carrier gas is flowed, $H_2$ and $N_2$ are pulsed is pulsed, and $WF_6$ flow is turned off. The deposition cycle 411A further includes a $WF_6$ dose 460A and a purge phase 470A as described above with reference to FIG. 2C. These operations are repeated as shown at 420B, 440B, 460B, and 470B, in the subsequent deposition cycle. Sidewall roughness is significantly reduced using the timing sequence shown in FIG. 4 as compared to one without nitrogen flow during the $H_2$ operation. In particular, it was found to reduce sidewall roughness by about half. This may be due to $N_2$ addition on the surface inhibiting the W adsorbed atom (adatom) diffusion and suppressing tungsten growth at the feature corners. Notably, flowing $N_2$ during the reducing agent dose was found to reduce roughness more than if flowed during the tungsten precursor pulse.

According to various embodiments, $N_2$ may represent about 10-30% (vol.) of the total $N_2+H_2$ flow. Higher $N_2$ flows may be used, which can lead to a further decrease in roughness but an increase in film resistivity and/or stress.

Stress increase can be prevented or avoided by using a relatively high temperature, e.g., 375° C. or above such as 400° C.

In some embodiments, roughness is improved by using a chamber pressure of at least 20 Torr, or 25 Torr the ALD process of FIG. 2B. For example, deposition cycles 200 and 400 as shown in FIGS. 2C and 4, respectively, may be performed at about 25 Torr. This shows improvement over 10 Torr, which may be due to reducing W adatom diffusion length. Chamber pressure may be between 2.0 and 40 Torr for reduced roughness. At pressures higher than 40 Torr, step coverage can be compromised as the process becomes too CVD-like and purging can be difficult.

In some embodiments, the tungsten precursor is delivered with a high dose pressure during operation 286. As described below, the gas lines may be charged to deliver each reactant. Delivering the tungsten precursor at a high charge pressure, e.g., at least 300 Torr or about 400 Torr, results in lower roughness. This may be due to higher adsorption on the surface, which limits the adatom diffusion. In some embodiments, the tungsten precursor is delivered at pressures between 400 Torr and 700 Torr.

Table 1, below, shows the reduction in roughness achieved for different process conditions within the scope of the disclosure. Tungsten was deposited in a 3-D NAND structure to fill wordline features and sidewall roughness was measured

| Process | A - baseline | B | C | D |
|---|---|---|---|---|
| Tungsten precursor pulse | WF6 | WF6 | WF6 | WF6 |
| Reducing agent pulse | H2 | H2 – N2 (N2 between 10%-30% of total H2 + N2) | H2 | H2 |
| Chamber Pressure | 10 Torr | 10 Torr | 25 Torr | 10 Torr |
| WF6 charge | 180 Torr | 180 Torr | 180 Torr | 400 Torr |
| RMS sidewall roughness | 3.67 nm | 1.69 nm | 2.32 nm | 2.61 nm |

At high temperatures, the sidewall roughness can be reduced by co-flowing $N_2$ with $WF_6$. For example, at temperatures greater than 400° C., co-flowing $N_2$ with $WF_6$ (or other precursor) has been shown to reduce roughness from 7.4 nm to 3.5 nm. The $N_2$ may be from 0%-90% vol. of the total $N_2+WF_6$ flow, with higher $N_2$ resulting in lower roughness without degrading film properties. At lower temperatures (e.g., 300° C.), the roughness may not be improved. This is in contrast to the other methods described above in which roughness can be reduced at low temperatures such as 300° C.

Figure 5A:
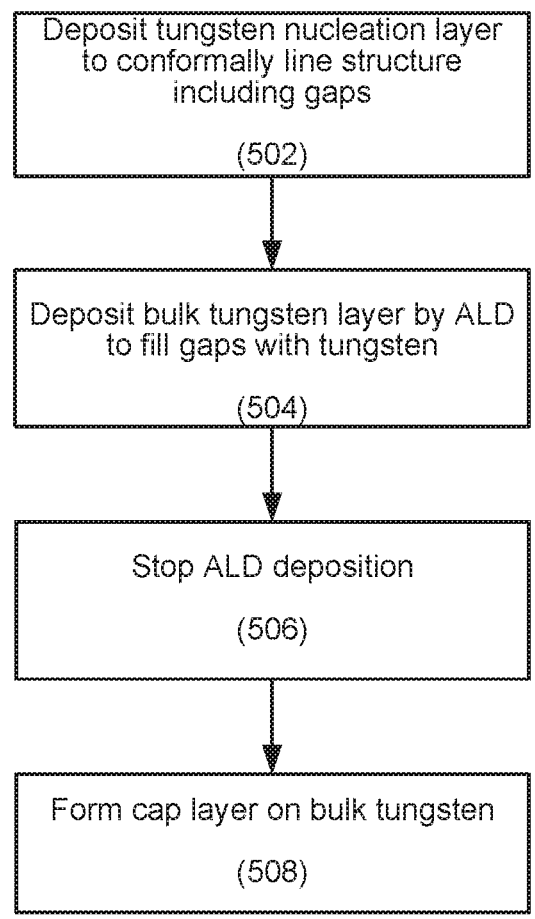
FIGS. 5A-5D are process flow diagrams depicting operations for methods in accordance with certain disclosed embodiments.

FIG. 5A is a process flow diagram showing another method of filling a structure having gaps with tungsten. In some embodiments, the structure is a 3D NAND structure as shown in FIG. 1A. The method begins at an operation 502 with depositing a tungsten nucleation layer to conformally line the structure with tungsten. Operation 502 may be performed as described above with reference to operations 202-210 of FIG. 2A. In some embodiments, silicon-containing and/or boron-containing reducing agents are employed during the tungsten nucleation layer deposition. In some embodiments, operation 502 may be omitted, as described above. Next, a bulk tungsten layer is deposited by ALD to fill gaps in the structure in an operation 504. Operation 504 may be performed as described above with reference to operations 282-290 of FIG. 2A and/or timing sequence diagrams 200 and 400 in FIGS. 2C and 4, respectively. However, rather than allow the deposition to continue to deposit outside the feature (e.g., at 346 in the example of FIG. 4), the deposition is stopped at an operation 506. At this point, the interior of the wordline feature may be completely or filled. A cap layer is then formed on the bulk tungsten in an operation 508. The cap layer is a relatively thin layer—thinner than the bulk tungsten layer—and may be deposited by CVD or ALD in some embodiments. Example thickness range from 100-200 Angstroms. Examples of cap layers include amorphous tungsten and tungsten oxide layers. The cap layer may be formed only outside of the wordline features.

In some embodiments, block 508 involves CVD deposition of a cap layer on the sidewalls of a 3D-NAND structure. CVD deposition on 3D-NAND structures has improved sidewall smoothness. This is because of its higher deposition rate, allowing less time for W adatom surface diffusion. Accordingly, transitioning from block 506 to block 508 can involve transitioning from alternating pulses of tungsten precursor and (hydrogen or other reducing agent) to concurrent introduction of the tungsten precursor and the reducing agent into the deposition chamber.

In some embodiments, block 508 involves forming a tungsten oxide cap layer on the sidewalk of a 3D-NAND structure. This can involve depositing a relatively thin ALD layer of tungsten following the timing sequences of FIG. 2C or 4, for example, then exposing the structure to air to oxide the layer and then repeating. For example, block 508 can involve ALD deposition of about 20 Angstroms of tungsten, oxidation and repeat to form 100-200 Angstroms of tungsten oxide.

In some embodiments, block 508 can involve deposition of an ALD tungsten layer formed by a method as described above with respect to FIG. 2A. While the cap layer is not a "nucleation" layer in the sense that there is typically not bulk deposition on it, it can be smoother than the bulk layer. The ALD tungsten layer deposited by a silane or boron reducing agent and a tungsten precursor may be an amorphous tungsten layer.

Table 2, below, shows the reduction in roughness achieved for different cap layers within the scope of the disclosure. Tungsten was deposited in a 3-D NAND structure to fill wordline features and sidewall roughness was measured

| | F - baseline | G | H | I |
|---|---|---|---|---|
| Cap layer | None | CVD WF6/H2 | Tungsten oxide | W "nucleation" layer (ALD) WF6/B2H6) |
| RMS sidewall roughness | 3.67 nm | 2.06 nm | 3.08 nm | 1.47 nm |

It should be noted that the higher resistivity of the cap layer can be tolerated as it will be removed during a subsequent etch operations.

Figure 5B:
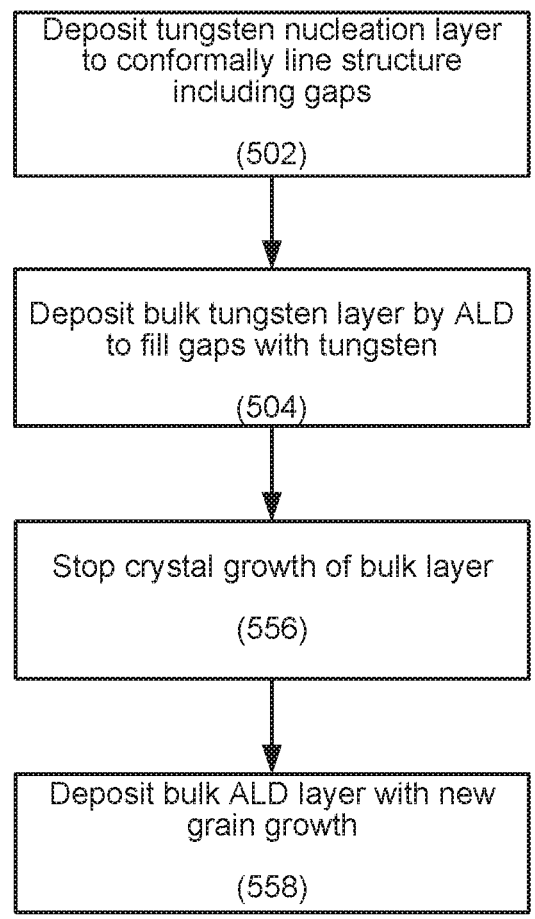

FIG. 5B is a process flow diagram showing another method of filling a structure having gaps with tungsten. In FIG. 5B, operations 602 and 604 may be performed as described above with respect to FIG. 5A. At 556, crystal growth of the ALD layer is stopped. This can involve stopping the ALD deposition and performing a process to interrupt the grain growth. In some embodiments, block 558 can involve a nitrogen ($N_2$) soak or a tungsten nucleation layer deposition as described above with respect to FIG. 2A. A bulk layer deposition process is then performed as described above with respect to FIGS. 2C and 4, however, the grain growth begins anew, reducing roughness. In some embodiments, the bulk layer deposition conditions may be changed from operation 504 to operation 558. For example, operation 504 may involve a timing diagram as described in FIG. 2C, without nitrogen co-flow, with nitrogen added as in FIG. 4 for operation 558. Similarly, the chamber pressure and/or tungsten delivery pressure may be increased in operation 558.

Figure 5C:
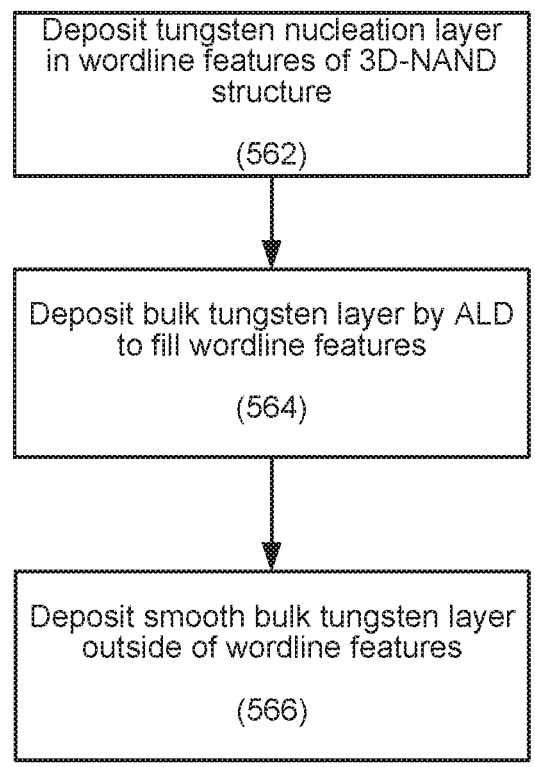

FIG. 5C is a process flow diagram showing method of filling a 3D-NAND structure with tungsten. The method described in FIG. 5C may also be applied to other structures having gaps to be filled. The method begins at an operation 562 with depositing a tungsten nucleation layer to conformally line the wordline features with tungsten. Operation 562 may be performed as described above with reference to operations 202-210 of FIG. 2A. In some embodiments, silicon-containing and/or boron-containing reducing agents are employed during the tungsten nucleation layer deposition. In some embodiments, operation 502 may be omitted, as described above. Next, a bulk tungsten layer is deposited by ALD to fill the wordline features in the structure in an operation 564. Operation 564 may be performed as described above with reference to operations 282-290 of FIG. 2A and/or timing sequence diagrams 200 in FIG. 2C. Once the wordline features are filled, a smooth bulk tungsten layer is deposited outside of the wordline features in an operation 566. Operation 566 may use one or more of the techniques described above: adding $N_2$ to the $H_2$ pulses, increasing process pressure, increasing tungsten precursor delivery pressure, depositing a cap layer, and interrupting grain growth. In some embodiments, the transition from operation 564 to 566 is gradual; e.g., nitrogen may be gradually added to the reducing agent pulse as the wordline features near completion. It should also be noted that the wordline features may fill at different times; operation 566 may be implemented after some or all of the features are filled.

Figure 5D:
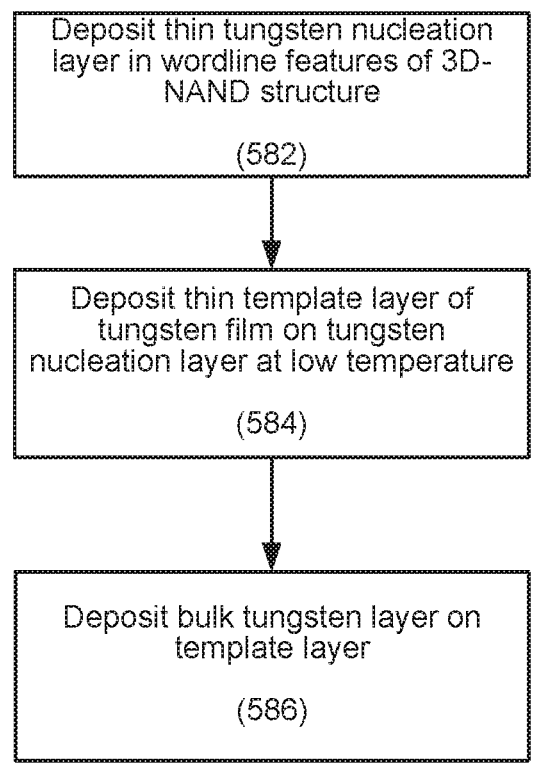

FIG. 5D is a process flow diagram showing another method of filling a 3D-NAND structure with tungsten. The method described in FIG. 5D may also be applied to other structures having gaps to be filled. The method begins at an operation 582 with depositing a thin tungsten nucleation layer to conformally line the wordline features with tungsten. Operation 582 may be performed as described above with reference to operations 202-210 of FIG. 2A. In some embodiments, silicon-containing and/or boron-containing reducing agents are employed during the tungsten nucleation layer deposition. In the method of FIG. 5D, however, the deposited nucleation layer is thinner than what otherwise be deposited. Ranges for nucleation layers in operation 582 may be between about 15 Å-25 Å, as opposed to 25 Å-40 Å that may be used in certain other embodiments. Reducing the nucleation thickness can effectively change the nucleation site density, thus modulating the grain size of crystalline growth and reducing roughness. Tungsten nucleation layers of less than 20 Å may be used. However, one drawback of reducing grain size may be an increase in resistivity. An increase in resistivity can occur due to excess boron from the reducing agent being present in the nucleation layer if the nucleation layer is not fully converted. In some embodiments, operation 582 involves mitigating excess boron residue by increasing argon dilution and/or increasing tungsten precursor exposure time. For example, in some embodiments, a $B_2H_6$:Ar dilution is at least 1:5 or 1:9. This is increased from a 1:3 dilution used in certain other nucleation layer depositions. The dilution can be increased even further, though at levels such as 1:20, the step coverage may be poor. In some embodiments, the dilution level is 1:5-1:12, for example. In some embodiments, the tungsten precursor pulse is of longer duration than the reducing agent pulse, for example at least 1.5 or 2 times as long.

In some embodiments, a thin template layer of tungsten is then deposited on the nucleation layer in an operation 584. This operation may be performed in addition to or instead of limiting boron incorporation in operation 582. In some embodiments, operation 584 may be omitted if resistance increase is effectively mitigated in operation 584. If performed, operation 584 involves ALD using pulses of $WF_6$ (or other tungsten precursor) and $H_2$ reducing agent a low temperatures, of between 250° C.-350° C., or in some embodiments, 250° C.-325° C., or 250° C.-300° C. In some embodiments, temperatures of less than 300° C. may be used. Example thicknesses of the template film may be 20 Å-50 Å, or about 30 Å. This low temperature template layer provides a better template for large grain growth in the subsequent bulk tungsten deposition. The method then continues with depositing bulk tungsten on the template layer in an operation 586. This also may be performed by an ALD $WF_6/H_2$ operation (or using other tungsten precursors) but at higher temperatures, e.g., 350°-450° C., or above 375° C. Examples of total tungsten deposition may be about 300 Å, including the nucleation layer, template layer, and bulk layer. In some embodiments, for example, a deposition sequence may involve:

ALD deposition of a tungsten nucleation layer: $WF_6/B_2H_6$ pulses

ALD deposition of a template layer: $WF_6/H_2$ pulses at 250° C.-350° C.;

Raise substrate temperature, e.g., at least 50° C.;

ALD deposition of bulk layer: $WF_6/H_2$ pulses at 350° C.-450° C.

The method described in FIG. 5D may also be implemented in combination with any of the methods that are described above. For example, depositing a thin tungsten nucleation layer as described above, with or without a subsequent template layer, may be performed in any of the methods described with reference to FIGS. 5A-5C.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, atomic layer deposition (ALD) may be performed at a first station that is one of two, five, or even more deposition stations positioned within a single deposition chamber. Thus, for example, diborane ($B_2H_6$) and tungsten hexafluoride ($WF_6$) may be introduced in alternating pulses to the surface of the semiconductor substrate, at the first station, using an individual gas supply system that creates a localized atmosphere at the substrate surface. Another station may be used for tungsten bulk layer deposition. Another station may be used to deposit a cap layer by CVD. Two or more stations may be used to deposit tungsten in parallel processing. Alternatively a wafer may be indexed to have operations performed over two or more stations sequentially.

Figure 6:
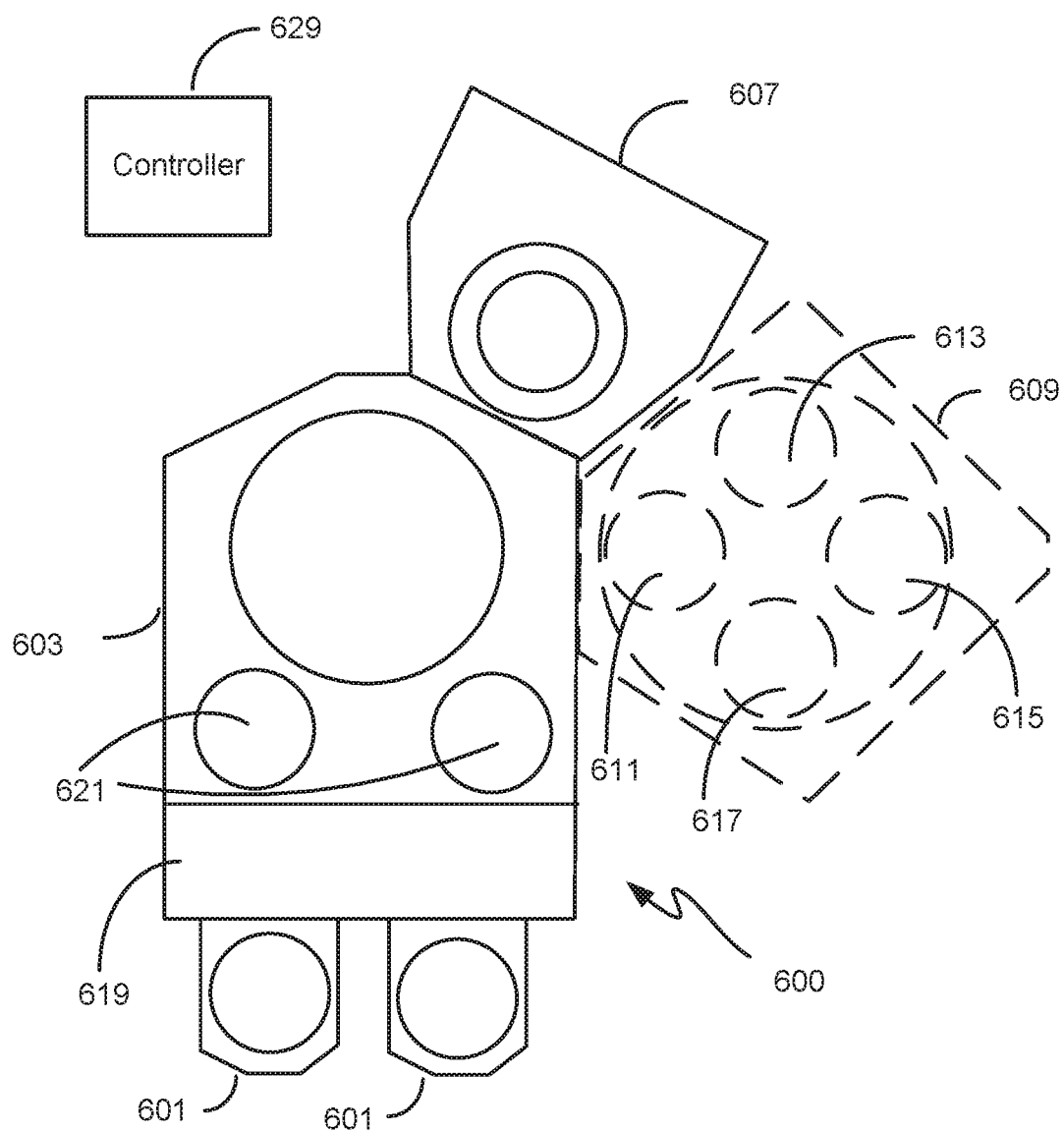
FIG. 6 is a schematic diagram of an example process tool for performing certain disclosed embodiments.

FIG. 6 is a schematic of a process system suitable for conducting deposition processes in accordance with embodiments. The system 600 includes a transfer module 603. The transfer module 603 provides a clean, pressurized environment to minimize risk of contamination of substrates being processed as they are moved between various reactor modules. Mounted on the transfer module 603 is a multi-station reactor 609 capable of performing ALD and CVD according to various embodiments. Multi-station reactor 609 may include multiple stations 611, 613, 615, and 617 that may sequentially perform operations in accordance with disclosed embodiments. For example, multi-station reactor 609 may be configured such that station 611 performs a tungsten nucleation layer deposition using a chlorine-containing tungsten precursor or a fluorine-containing precursor, and station 613 performs an ALD tungsten deposition operation according to various embodiments. In some embodiments, station 615 may also form an ALD tungsten deposition operation, and station 617 may perform a CVD operation.

Figure 7:
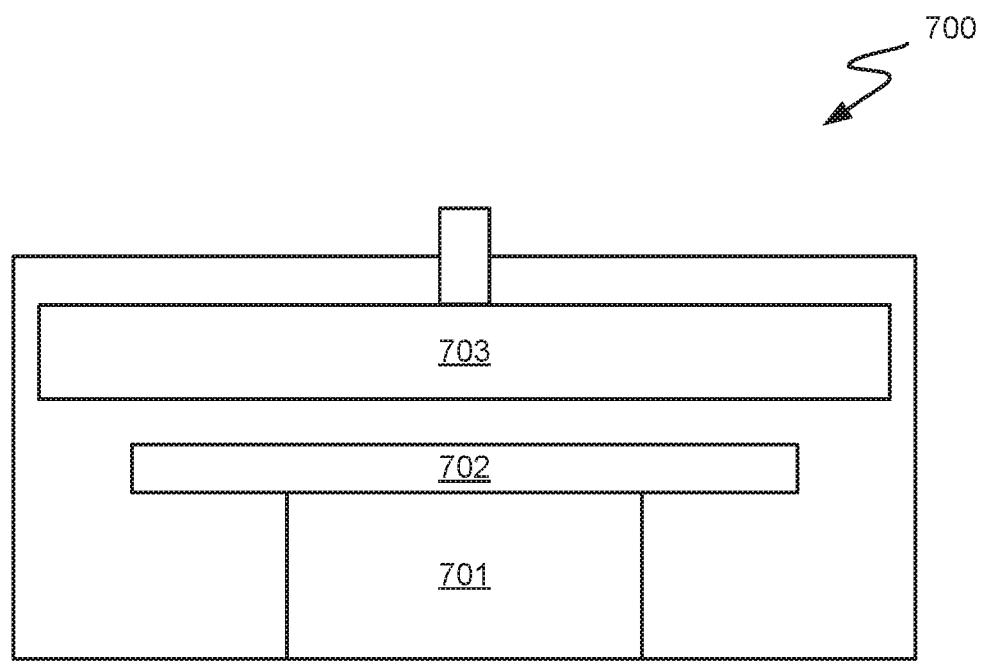
FIG. 7 is a schematic diagram of an example station for performing certain disclosed embodiments.

Stations may include a heated pedestal or substrate support, one or more gas inlets or showerhead or dispersion plate. An example of a deposition station 700 is depicted in FIG. 7, including substrate support 702 and showerhead 703. A heater may be provided in pedestal portion 701.

Returning to FIG. 6, also mounted on the transfer module 503 may be one or more single or multi-station modules 607 capable of performing plasma or chemical (non-plasma) pre-cleans, other deposition operations, or etch operations. The module may also be used for various treatments to, for example, prepare a substrate for a deposition process. The system 600 also includes one or more wafer source modules 601, where wafers are stored before and after processing. An atmospheric robot (not shown) in the atmospheric transfer chamber 619 may first remove wafers from the source modules 601 to loadlocks 621. A wafer transfer device (generally a robot arm unit) in the transfer module 603 moves the wafers from loadlocks 621 to and among the modules mounted on the transfer module 603.

In various embodiments, a system controller 629 is employed to control process conditions during deposition. The controller 629 will typically include one or more memory devices and one or more processors. A processor may include a CPU or computer, analog and/or digital input/output connections, stepper motor controller boards, etc.

The controller 629 may control all of the activities of the deposition apparatus. The system controller 629 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 629 may be employed in some embodiments.

Typically there will be a user interface associated with the controller 629. The user interface may include a display screen; graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 629. The signals for controlling the process are output on the analog and digital output connections of the deposition apparatus 600.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 629 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 629, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, water transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 629, in some implementations, may be a part of or coupled to a computer that is integrated with, coupled to the system, otherwise networked to the system, or a combination thereof. For example, the controller 629 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module; a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 629 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

Figure 8:
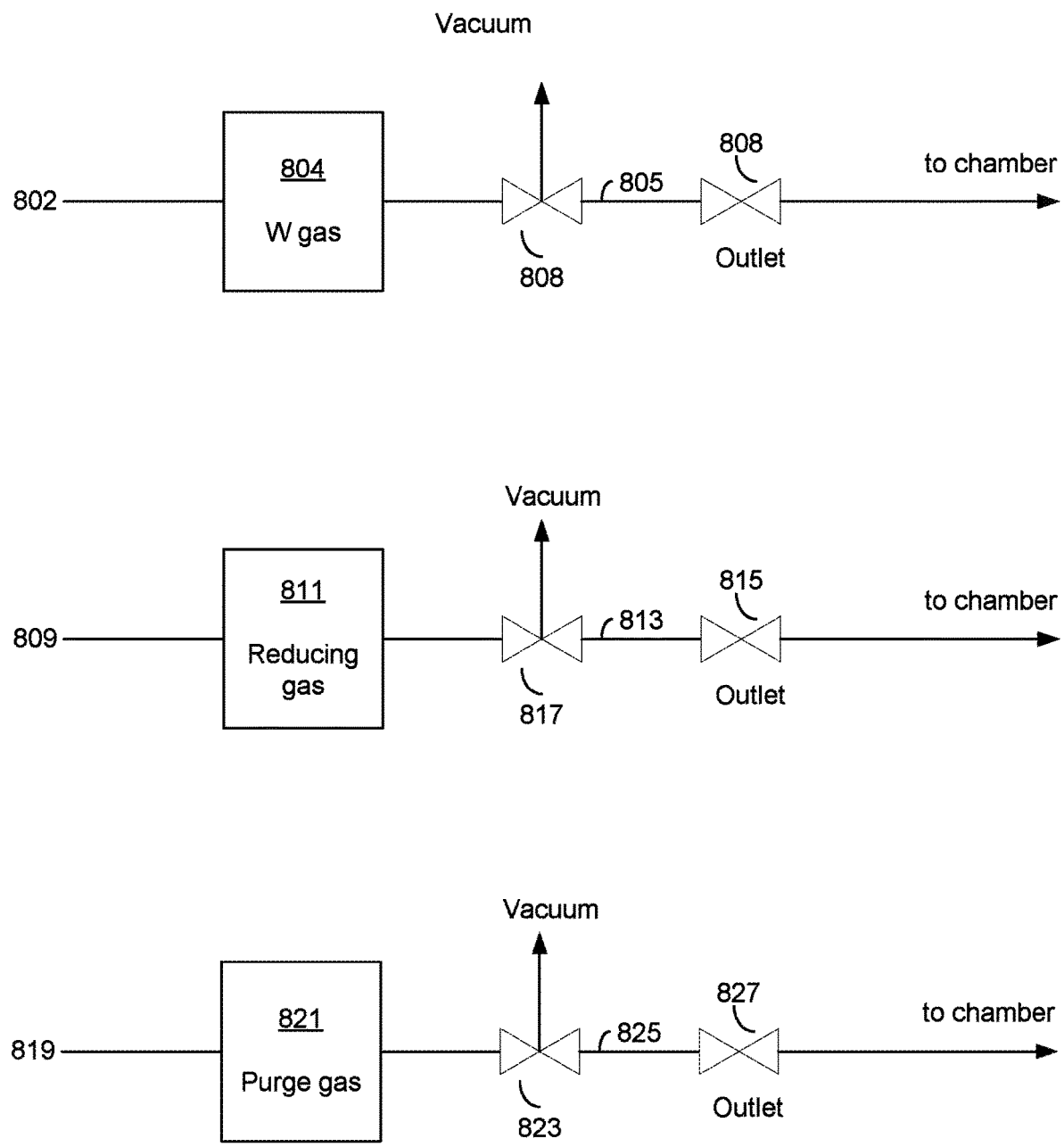
FIG. 8 is a schematic diagram showing basic features of a manifold system that may be used in accordance with certain embodiments.

The apparatus may include a gas manifold system, which provides line charges to the various gas distribution lines as shown schematically in FIG. 8. Manifold 804 has an input 802 from a source of a tungsten-containing precursor gas (not shown), manifold 811 has an input 809 from a source of hydrogen or other reducing gas (not shown) and manifold 821 has an input 819 from a source of inert purge gas (not shown). The manifolds 804, 811 and 821 provide the tungsten-containing precursor gas, reducing gas and purge gas to the deposition chamber through valved distribution lines, 805, 813 and 825 respectively. The various valves are opened or closed to provide a line charge; i.e., to pressurize the distribution lines. For example, to pressurize distribution line 805, valve 806 is closed to vacuum and valve 808 is closed. After a suitable increment of time, valve 808 is opened and the tungsten-containing precursor gas is delivered to the chamber. Charging the tungsten precursor to a high pressure during ALD deposition of the bulk layer (e.g., to 400 Torr) can improve resistivity in some embodiments. After a suitable time for delivery of the gas, valve 808 is closed. The chamber can then be purged to a vacuum by opening of valve 806 to vacuum.

Similar processes are used to deliver the reducing gas and the purge gas. To introduce the reducing gas, for example, distribution line 813 is charged by closing valve 815 and closing valve 817 to vacuum. Opening of valve 815 allows for delivery of the reducing gas to the chamber. Similarly, to introduce the purge gas, distribution line 825 is charged by closing valve 827 and closing valve 823 to vacuum. Opening of valve 827 allows for delivery of the argon or other inert purge gas to the chamber. The amount of time allowed for line charges changes the amount and timing of the initial delivery of the gas.

FIG. 8 also shows vacuum pumps in which valves 806, 817 and 823, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

Note that the processes described above may require precise timing of valves and mass flow controllers (MFCs) supplying pulses of reagent to the semiconductor substrate during deposition. In one way to make this possible, valve and MK commands are delivered to embedded digital input-output controllers (IOC) in discrete packets of information containing instructions for all time-critical commands for all or a part of a deposition sequence. The ALTUS systems of Lam Research provide at least one IOC sequence. The IOCs can be physically located at various points in the apparatus; e.g., within the process module or on a stand-alone power rack standing some distance away from the process module. There may be multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, ALD to run at station 1-2 with all timing controlled for all the hardware components needed to deposit a ALD-W nucleation layer at those stations. A second sequence might be running concurrently to deposit a tungsten bulk using the timing sequence described above at other deposition stations in the same module. The relative timing of the devices controlling the delivery of reagents to stations 3-4 is important within that group of devices, but the relative timing of the ALD process at stations 1-2 can be offset from the relative timing of stations 3-4. An IOC translates the information in a packetized sequence and delivers digital or analog command signals directly to MFC or pneumatic solenoid banks controlling the valves.

A pulse of tungsten-containing gas may be generated as follows. Initially, the system diverts $WF_6$ to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 606 and the outlet 608 to the deposition chamber. This may be done for a period of between about 0.1 and 5 seconds, for example, to create an initial burst of reagent when the outlet to the deposition chamber is opened. This is accomplished by opening outlet valve 808 for between about 0.1 and 10 seconds in one example. Thereafter, the tungsten-containing gas is purged from the deposition chamber using a suitable purge gas. The pulsed flow of other reagents may be done in a similar manner.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a structure to be filled with a tungsten-containing material;
   exposing the structure to multiple deposition cycles, wherein each deposition cycle comprises sequentially delivering a dose of hydrogen ($H_2$) co-flowed with nitrogen ($N_2$) and a dose of a tungsten precursor to a chamber housing the structure,
   wherein the $N_2$ is greater than 30% (vol) of the total $N_2+H_2$ flow and the substrate temperature is at least 375° C. during the dose of $H_2$ co-flowed with $N_2$.

2. The method of claim 1, wherein the structure is a partially fabricated three-dimension (3-D) NAND structure comprising sidewalls and a plurality of openings in the sidewalls leading to a plurality of features having a plurality of interior regions fluidically accessible through the openings.

3. The method of claim 1, wherein the dose of the tungsten precursor is delivered at a higher pressure than the dose of $H_2$ co-flowed with $N_2$.

4. The method of claim 1, wherein the dose of the tungsten precursor is delivered at a pressure of at least 300 Torr.

5. The method of claim 1, wherein the dose of the tungsten precursor is delivered without nitrogen.

6. The method of claim 1, wherein $N_2$ is between 10-30% (vol.) of the total $N_2+H_2$ flow of the dose of $H_2$ co-flowed with $N_2$.

7. The method of claim 6, wherein the substrate temperature is no more than 350° C. during the dose of $H_2$ co-flowed with $N_2$.

8. The method of claim 1, wherein the tungsten precursor is tungsten hexafluoride.

9. The method of claim 1, wherein the tungsten precursor is a chlorine-containing tungsten precursor.

10. A method comprising:
    providing a partially fabricated three-dimensional (3-D) NAND structure having a central vertical structure having a plurality of openings on opposing sidewalls of the central vertical structure, the plurality of openings leading to wordline features separated by oxide layers, the wordline features to be filled with a tungsten-containing material;
    exposing the 3-D NAND structure to multiple deposition cycles, wherein each deposition cycle comprises sequentially delivering a dose of hydrogen ($H_2$) and a dose of a tungsten precursor to deposit a bulk tungsten film in the wordline features; and
    forming a tungsten-containing cap layer on the opposing sidewalls of the central vertical structure including on the filled wordline features and the oxide layers.

11. The method of claim 10, wherein the cap layer is a tungsten oxide layer.

12. The method of claim 10, wherein the cap layer is an amorphous tungsten layer.

13. The method of claim 10, wherein the structure is provided to a multi-station deposition chamber and wherein the multiple deposition cycles are performed in one or more first stations of the multi-station deposition chamber and the cap layer is formed in one or more second station of the multi-station deposition chamber.

14. The method of claim 10, wherein the dose of $H_2$ is co-flowed with $N_2$.

15. A method comprising:
   (a) depositing a tungsten nucleation layer in a feature on a substrate by alternating pulses of a tungsten precursor and a boron-containing reducing agent;
   (b) depositing a tungsten template layer on the tungsten nucleation layer by alternating pulses of a tungsten precursor and hydrogen ($H_2$) at a substrate temperature between 250° C. and 350° C.;
   (c) after (b), raising the substrate temperature by at least 50° C.; and
   (d) after (c), depositing a tungsten bulk layer by alternating pulses of a tungsten precursor and hydrogen ($H_2$) at a substrate temperature of at least 350° C.

16. The method of claim 15, wherein the tungsten nucleation layer is deposited to a thickness of no more than 30 Å.

* * * * *